United States Patent
Xie et al.

(10) Patent No.: US 12,347,516 B2
(45) Date of Patent: Jul. 1, 2025

(54) RANDOM ACCESS MEMORY AND SENSE-AMPLIFYING COMPENSATION CIRCUIT THEREOF

(71) Applicant: GigaDevice Semiconductor Inc., Beijing (CN)

(72) Inventors: Miao Xie, Beijing (CN); Shaoxu Jia, Beijing (CN)

(73) Assignee: GigaDevice Semiconductor Inc., Beijing (CN)

( * ) Notice: Subject to any disclaimer, the term of this patent is extended or adjusted under 35 U.S.C. 154(b) by 226 days.

(21) Appl. No.: 18/197,106

(22) Filed: May 15, 2023

(65) Prior Publication Data
US 2024/0170030 A1    May 23, 2024

(30) Foreign Application Priority Data
Nov. 23, 2022    (CN) .......................... 202211477210.0

(51) Int. Cl.
*G11C 7/08*    (2006.01)
*G11C 7/12*    (2006.01)

(52) U.S. Cl.
CPC . *G11C 7/08* (2013.01); *G11C 7/12* (2013.01)

(58) Field of Classification Search
CPC ...................................................... G11C 7/08
See application file for complete search history.

(56) References Cited

U.S. PATENT DOCUMENTS

| | | | |
|---|---|---|---|
| 9,773,544 B2 | 9/2017 | Woo et al. | |
| 11,894,047 B2 * | 2/2024 | Peng | G11C 7/065 |
| 2002/0163844 A1 * | 11/2002 | Kurjanowicz | G11C 11/4094 365/210.1 |
| 2003/0035334 A1 * | 2/2003 | Terzioglu | G11C 7/06 365/207 |
| 2004/0136253 A1 * | 7/2004 | Gupta | G11C 7/065 365/205 |
| 2005/0073339 A1 * | 4/2005 | Rho | H03K 5/2481 327/50 |
| 2012/0092072 A1 * | 4/2012 | Upputuri | H03F 3/45179 330/277 |
| 2016/0012868 A1 * | 1/2016 | Moon | G11C 7/065 365/189.11 |
| 2022/0157369 A1 * | 5/2022 | Kim | G11C 11/4094 |
| 2022/0208235 A1 * | 6/2022 | Peng | G11C 7/02 |

* cited by examiner

*Primary Examiner* — Douglas King

(57) ABSTRACT

The present disclosure discloses a random access memory and a sense-amplifying (SA) compensation circuit thereof. The SA compensation circuit includes: a SA module, connected between a target bit line and a complementary bit line, and connected to SA voltage lines; an offset cancellation module, connected between the target bit line and the SA module and connected between the complementary bit line and the SA module; and a drive module, configured to be connected to the SA voltage line and configured to drive the SA voltage line in the offset cancellation stage and a sensing stage; wherein, the drive module is adjustable and is configured to drive the SA voltage line in an adjustable manner during the offset cancellation stage, to adjust driving capabilities of the SA voltage line to perform the offset cancellation operation.

20 Claims, 13 Drawing Sheets

RANDOM ACCESS MEMORY AND SENSE-AMPLIFYING COMPENSATION CIRCUIT THEREOF

CROSS-REFERENCE TO RELATED APPLICATIONS

The present disclosure claims priority of Chinese Patent Application No. 202211477210.0, titled "RANDOM ACCESS MEMORY AND SENSE-AMPLIFYING COMPENSATION CIRCUIT THEREOF", filed on Nov. 23, 2022, the contents of which are hereby incorporated by reference.

TECHNICAL FIELD

The present disclosure relates to the field of memory technologies, and in particular, to a random access memory and a sense-amplifying (SA) compensation circuit thereof.

BACKGROUND

A process of reading data in a memory cell in a random access memory is generally as follows: first, a complementary bit line (BL) pair (including a target bit line (BL) and a complementary bit line (BL #)) is pre-charged, and then the complementary bit line (BL) is charged to an initial potential Vref; after an active command is received, a word line (WL) is opened, so that charges stored in a capacitor in the memory cell can be shared with the target bit line (BL). If an original voltage of the capacitor is greater than the initial potential Vref, a voltage of the target bit line (BL) after the charges are shared will also be greater than the initial potential Vref, otherwise, if the original voltage of the capacitor is less than the initial potential Vref, then the voltage of the target bit line (BL) after the charges are shared will also be less than the initial potential Vref. After the charges are shared, a certain voltage difference is generated between the target bit line (BL) and the complementary bit line (BL #). This voltage difference is sensitively amplified to the full swing signal through a sense amplifier (SA) and is output.

The random access memory will be performed an activation operation before executing a read/write command. The activation operation is a process of taking out and amplifying the data in the memory cell, and is a first step to affect whether read and write results of the random access memory are correct. Therefore, the activation operation is very important. A process of the activation operation generally includes pre-charging, offset cancellation, charge sharing, sensing and restoring stages. An offset cancellation operation performed in the offset cancellation stage is a key to compensate a reading deviation.

SUMMARY

In order to solve the above problems, the present disclosure provides a random access memory and a sense-amplifying (SA) compensation circuit thereof.

In order to solve the above technical problems, a technical solution adopted by the present disclosure is to provide a sense-amplifying (SA) compensation circuit. The SA compensation circuit is applied to a random access memory, and includes a SA module, an offset cancellation module, and a drive module. The SA module is connected between a target bit line and a complementary bit line, and is connected to SA voltage lines. In a charge sharing stage, the target bit line shares storage charges stored in a corresponding turned-on memory cell. In a sensing stage, the SA module is configured to pull a target bit-line voltage of the target bit line, which has shared the storage charges, to one of a first SA voltage and a second SA voltage, and is configured to pull a complementary bit-line voltage of the complementary bit line, to the other of the first SA voltage and the second SA voltage. The offset cancellation module is connected between the target bit line and the SA module and is connected between the complementary bit line and the SA module, and is configured to perform an offset cancellation operation in an offset cancellation stage, for generating an offset cancellation voltage between the target bit line and the complementary bit line. The drive module is configured to be connected to the SA voltage lines and is configured to drive the SA voltage lines to a state of the first SA voltage and the second SA voltage in the offset cancellation stage and the sensing stage. The drive module is an adjustable drive module and is configured to drive the SA voltage lines in an adjustable manner during the offset cancellation stage, to adjust driving capabilities of the SA voltage lines to perform the offset cancellation operation.

To solve the above technical problems, another technical solution adopted by the present disclosure is to provide a random access memory, and the random access memory includes the SA compensation circuit as described above.

BRIEF DESCRIPTION OF THE DRAWINGS

In order to make the technical solution described in embodiments of the present disclosure more clearly, the drawings used for the description of the embodiments or background will be described. Apparently, the drawings in the following description are only some embodiments of the present disclosure. For those skilled in the art, other drawings may be acquired according to the drawings without any creative work.

Figure 1:
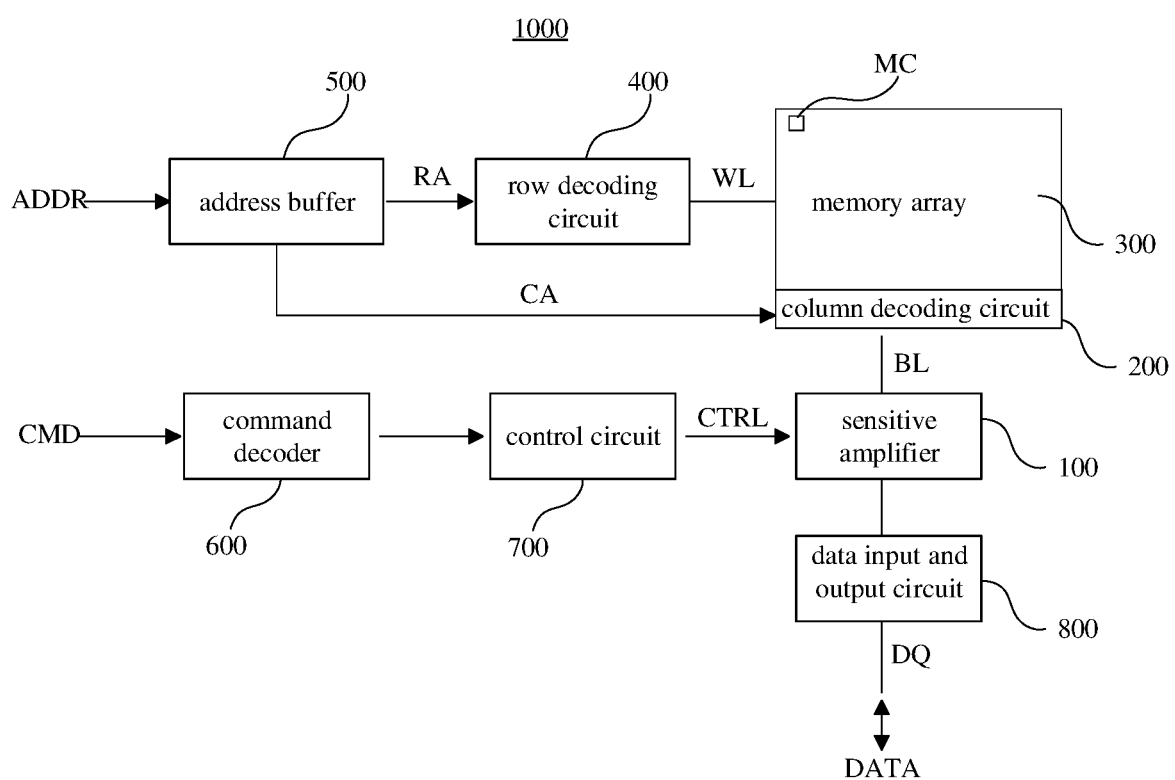
FIG. 1 is a structural schematic view of a random access memory provided by the present disclosure.

DETAILED DESCRIPTION OF THE
PREFERRED EMBODIMENTS

The technical solutions in the embodiments of the present disclosure are clearly and completely described in conjunction with the drawings in the embodiments of the present disclosure. It is understood that the specific embodiments described herein are only configured to explain the relevant disclosure, not to limit the present disclosure. In addition, it should also be noted that, for the convenience of description, only the parts, not the whole structure, related to the relevant disclosure are shown in the drawings. Other embodiments obtained by those skilled in the art based on the embodiments of the present disclosure without creative efforts shall fall within the protection scope of the present disclosure.

Reference to "embodiment" herein means that specific features, structures or characteristics described the embodiments may be included in at least one embodiment of the present disclosure. The presence of the term in various places in the description does not necessarily refer to the same embodiment, nor is it an independent or alternative embodiment mutually exclusive with other embodiments. It is explicitly and implicitly understood by those skilled in the art that the embodiments described herein may be combined with other embodiments. In some embodiments, a sense-amplifying (SA) compensation circuit is provided by the present disclosure. The SA compensation circuit is applied to a random access memory, and includes a SA module, an offset cancellation module, and a drive module. The SA module is connected between a target bit line and a complementary bit line, and is connected to SA voltage lines. In a charge sharing stage, the target bit line shares storage charges stored in a corresponding turned-on memory cell. In a sensing stage, the SA module is configured to pull a target bit-line voltage of the target bit line, which has shared the storage charges, to one of a first SA voltage and a second SA voltage, and is configured to pull a complementary bit-line voltage of the complementary bit line, to the other of the first SA voltage and the second SA voltage. The offset cancellation module is connected between the target bit line and the SA module and is connected between the complementary bit line and the SA module, and is configured to perform an offset cancellation operation in an offset cancellation stage, for generating an offset cancellation voltage between the target bit line and the complementary bit line. The drive module is configured to be connected to the SA voltage lines and is configured to drive the SA voltage lines to a state of the first SA voltage and the second SA voltage in the offset cancellation stage and the sensing stage. The drive module is an adjustable drive module and is configured to drive the SA voltage lines in an adjustable manner during the offset cancellation stage, to adjust driving capabilities of the SA voltage lines to perform the offset cancellation operation.

In an embodiment, the SA voltage lines include a first SA voltage line and a second SA voltage line. The drive module includes a first drive sub-module and a second drive sub-module. The first drive sub-module is configured to be connected the first SA voltage line and is configured to drive the first SA voltage line. The second drive sub-module is configured to be connected the second SA voltage line and is configured to drive the second SA voltage line. A logic level represented by the first SA voltage is opposite to a logic level represented by the second SA voltage. At least one of the first drive sub-module and the second drive sub-module is adjustable.

In an embodiment, the first drive sub-module includes a first drive unit and a first switch unit, the first drive unit is configured to provide the first SA voltage, and the first drive unit is connected to the first SA voltage line via the first switch unit. The second drive sub-module includes a second drive unit and a second switch unit, the second drive unit is configured to provide the second SA voltage, and the second drive unit is connected to the second SA voltage line via the second switch unit.

In an embodiment, at least one of a quantity of turned-on first switches of the plurality of first switches and a quantity of turned-on second switches of the plurality of second switches is adjusted, to change at least one of a driving capability of the first SA voltage line and a driving capability of the second SA voltage line to perform the offset cancellation operation.

In an embodiment, in response to a corresponding memory cell needing to compensate for ability to read data "0", in the offset cancellation stage, the quantity of turned-on first switches of the plurality of first switches is greater than the quantity of turned-on second switches of the plurality of second switches, and driving capability of the first SA voltage line is greater than driving capability of the second SA voltage line. In response to the corresponding memory cell needing to compensate for ability to read data "1", in the offset cancellation stage, the quantity of turned-on first switches of the plurality of first switches is less than the quantity of turned-on second switches of the plurality of second switches, and the driving capability of the first SA voltage line is less than the driving capability of the second SA voltage line.

In an embodiment, in response to the corresponding memory cell needing to compensate for the ability to read data "0", in the offset cancellation stage, all of the plurality of first switches in the first switch unit are turned on to make the first switch unit in a strong-driving state, and one of the plurality of second switches in the second switch unit is turned on to make the second switch unit in a normal-driving state, and the driving capability of the first SA voltage line is greater than the driving capability of the second SA voltage line. In response to the corresponding memory cell needing to compensate for the ability to read data "1", in the offset cancellation stage, one of the plurality of first switches in the first switch unit is turned on to make the first switch unit in a normal-driving state, and all of the plurality of second switches in the second switch unit are turned on to make the second switch unit in a strong-driving state, and the driving capability of the first SA voltage line is less than the driving capability of the second SA voltage line.

In an embodiment, in response to the corresponding memory cell needing to compensate for the ability to read data "0", time of turning on the first switch unit is earlier than time of turning on the second switch unit in the sensing stage. In response to the corresponding memory cell to needing to compensate for the ability to read data "1", time of turning on the first switch unit is later than time of turning on the second switch unit in the sensing stage.

In an embodiment, in the offset cancellation stage, more than one of the plurality of first switches in the first switch unit and more than one of the plurality second switches in the second switch unit are turned on, to enhance the driving capability of the first SA voltage line and the driving capability of the second SA voltage line, and reduce a time length of the offset cancellation stage.

In an embodiment, when a sum of the time length of the offset cancellation stage and a time length of the charge sharing stage is set to a certain value, the more than one of the plurality of first switches in the first switch unit and the more than one of plurality of second switches in the second switch unit are turned on, to enhance the driving capability of the first SA voltage line and the driving capability of the second SA voltage line, and reduce the time length of the offset cancellation stage to increase the time length of the charge sharing stage.

In an embodiment, in the offset cancellation stage, a time length of turning on the first switch unit and the second switch unit is adjusted and extended, to enhance the driving capability of the first SA voltage line and the driving capability of the second SA voltage line to perform the offset cancellation operation.

In an embodiment, the SA module includes a first inversion unit and a second inversion unit. The first inversion unit is configured to be connected between the target bit line and the complementary bit line, and is configured to be connected to the first SA voltage line and the second SA voltage line. In the sensing stage, the first SA voltage line is driven to a state of the first SA voltage, and the second SA voltage line is driven to a state of the second SA voltage, the first inversion unit is configured to pull the complementary bit-line voltage of the complementary bit line to one of the first SA voltage and second SA voltage based on the target bit-line voltage of the target bit line, which has shared the storage charges. The second inversion unit is configured to be connected between the complementary bit line and the target bit line, and is configured to be connected to the first SA voltage line and the second SA voltage line. In the sensing stage, based on the complementary bit-line voltage of complementary bit line pulled to the second SA voltage, the second inversion unit is configured to pull the target bit-line voltage of the target bit line to the other of the first SA voltage and the second SA voltage.

In an embodiment, the first inversion unit includes a first transistor and a second transistor. A control end of the first transistor is connected to the target bit line, and a first channel end of the first transistor is connected to the second SA voltage line. A control end of the second transistor is connected the control end of the first transistor, and a first channel end of the second transistor is connected to the first SA voltage line. A second channel end of the first transistor and a second channel end of the second transistor are connected together via a first connection line, and the first connection line is configured to couple the complementary bit line. The second inversion unit includes a third transistor and a fourth transistor. A control end of the third transistor is connected to the complementary bit line, and a first channel end of the third transistor is connected to the second SA voltage line. A control end of the fourth transistor is connected to the control end of the third transistor, and a first channel end of the fourth transistor is connected to the first SA voltage line. A second channel end of the third transistor and a second channel end of the fourth transistor are connected together via a second connection line, and the second connection line is configured to couple the target bit line.

In an embodiment, the offset cancellation module includes a third switch unit, and the third switch unit includes a third switch and a fourth switch. The third switch is connected between the control end of the first transistor and the second channel end of the first transistor. The fourth switch is connected between the control end of the third transistor and the second channel end of the third transistor. In the offset cancellation stage, the third switch and the fourth switch are turned on, so that the first transistor and the third transistor are diode-connected respectively, and are configured to perform the offset cancellation operation by the driving capability of the first SA voltage line and the driving capability of the second SA voltage line. In the charge sharing stage and the sensing stage, the third switch and the fourth switch are turned off.

In an embodiment, the offset cancellation module further includes a fourth switch unit, and the fourth switch unit includes a fifth switch and a sixth switch. The fifth switch is connected between the control end of the second transistor and the control end of the first transistor. The sixth switch is connected between the control end of the fourth transistor and the control end of the third transistor. In the offset cancellation stage, the fifth switch and the sixth switch are turned off.

In an embodiment, the first connection line in the SA module is directly connected to the control end of the fourth transistor; the second connection line is directly connected to the control end of the second transistor. Alternatively, the SA module further includes a fifth switch unit, and the fifth switch unit includes a seventh switch and an eighth switch. The seventh switch is connected between the first connection line and the complementary bit line or the control end of the fourth transistor. The eighth switch is connected between the second connection line and the target bit line or the control end of the second transistor. In the offset compensation stage, the charge sharing stage and the sensing stage, the seventh switch and the eighth switch are turned on.

In an embodiment, the offset cancellation module includes a sixth switch unit, and the sixth switch unit includes a ninth switch and a tenth switch. The ninth switch is connected between the control end of the second transistor and the second channel end of the second transistor. The tenth switch is connected between the control end of the fourth transistor and the second channel end of the fourth transistor. In the offset cancellation stage, the ninth switch and the tenth switch are turned on, so that the second transistor and the fourth transistor are diode-connected respectively, and are configured to perform the offset cancellation operation by the driving capability of the SA voltage line in a high logic level and the SA voltage line in a low logic level. In the charge sharing stage and the sensing stage, the ninth switch and the tenth switch are turned off.

In an embodiment, the offset cancellation module includes a seventh switch unit, and the seventh switch unit includes an eleventh switch and a twelfth switch. The eleventh switch is connected between the control end of the second transistor and the control end of the first transistor. The twelfth switch is connected between the control end of the fourth transistor and the control end of the third transistor. In the offset cancellation stage, the eleventh switch and the twelfth switch are turned off, so that the first connection line and the third transistor and the second connection line and the first transistor form cross coupling.

In an embodiment, the target bit line is connected to the control end of the second transistor, and the complementary bit line is connected to the control end of the fourth transistor.

In some embodiments, a random access memory is provided by the present disclosure.

The random access memory includes a sense-amplifying (SA) compensation circuit. The SA compensation circuit is applied to a random access memory, and includes a SA module, an offset cancellation module, and a drive module. The SA module is connected between a target bit line and a complementary bit line, and is connected to SA voltage lines. In a charge sharing stage, the target bit line shares storage charges stored in a corresponding turned-on memory cell. In a sensing stage, the SA module is configured to pull a target bit-line voltage of the target bit line, which has shared the storage charges, to one of a first SA voltage and a second SA voltage, and is configured to pull a complementary bit-line voltage of the complementary bit line, to the other of the first SA voltage and the second SA voltage. The offset cancellation module is connected between the target bit line and the SA module and is connected between the complementary bit line and the SA module, and is configured to perform an offset cancellation operation in an offset cancellation stage, for generating an offset cancellation voltage between the target bit line and the complementary bit line. The drive module is configured to be connected to the SA voltage lines and is configured to drive the SA voltage lines to a state of the first SA voltage and the second SA voltage in the offset cancellation stage and the sensing stage. The drive module is an adjustable drive module and is configured to drive the SA voltage lines in an adjustable manner during the offset cancellation stage, to adjust driving capabilities of the SA voltage lines to perform the offset cancellation operation.

In an embodiment, the SA voltage lines include a first SA voltage line and a second SA voltage line. The drive module includes a first drive sub-module and a second drive sub-module. The first drive sub-module is configured to be connected the first SA voltage line and is configured to drive the first SA voltage line. The second drive sub-module is configured to be connected the second SA voltage line and is configured to drive the second SA voltage line. A logic level represented by the first SA voltage is opposite to a logic level represented by the second SA voltage. At least one of the first drive sub-module and the second drive sub-module is adjustable.

FIG. 1 is a structural schematic view of a random access memory provided by the present disclosure. The random access memory 1000 is a memory device based on semiconductor components. In the embodiment, the random access memory 1000 is specifically a dynamic random access memory (DRAM). The random access memory 1000 can output data (DATA) through a data wire DQ in response to a CMD command and an ADDR address sent by an external controller. The random access memory 1000 may include, but is not limited to, a sensitive amplifier 100, a column decoding circuit 200, a memory array 300, a row decoding circuit 400, an address buffer 500, a command decoder 600, a control circuit 700, and a data input and output circuit 800.

The memory array 300 includes a large number of memory cells (MCs), and the memory cells (MCs) are arranged in rows and columns to form a matrix array. The memory array 300 also includes a large number of word lines (WLs) and bit lines (BLs) connected to the memory cells (MCs). Specifically, the word line (WL)s are connected to the memory cells (MCs) in a direction of row arrangement of the memory cells (MCs), and the bit lines (BLs) are connected to the memory cells (MCs) in a direction of column arrangement of the memory cells (MCs).

The command decoder 600 can be configured to generate an internal command, such as an active instruction, a read instruction, a write instruction, a pre-charging instruction or other similar instructions, by decoding the CMD command sent by the external controller.

The control circuit 700 can be configured to generate control signals to control all operations of the random access memory 1000 in response to the internal command sent by the command decoder 600, such as the active instruction, the read instruction, the write instruction, the pre-charging instruction, or other similar instructions. Referring to FIG. 1, the control circuit 700 can be configured to generate a sensitive control signal CTRL to control operations of the sensitive amplifier 100. In the embodiment, a pre-charging operation, an offset cancellation operation and a sense-amplifying (SA) operation of the sensitive amplifier 100 can be controlled. In addition, the control circuit 700 can also be configured to generate control signals to control corresponding operations of the address buffer 500, the row decoding circuit 400, the column decoding circuit 200, the command decoder 600, the control circuit 700 and the data input and output circuit 800.

The address buffer 500 is configured to receive an address ADDR of the external controller and cache the address ADDR. The address ADDR includes row addresses of the row of the memory cells (MCs) in memory array 300 and column addresses of the column of the memory cells (MCs) in memory array 300. The address buffer 500 transmits the row address (RA) to the row decoding circuit 400 and the column address (CA) to the column decoding circuit 200.

The row decoding circuit 400 can be configured to select at least one of the large number of word lines (WLs) in the memory array 300. The row decoding circuit 400 can be configured to decode the row address (RA) transmitted by the address buffer 500, further, select at least one corresponding WL in response to the row address (RA), and activate the selected WL.

Similarly, the column decoding circuit 200 can be configured to select at least one of the bit lines (BLs) in the memory array 300. The column decoding circuit 200 can be configured to decode the column address (CA) transmitted by the address buffer 500, and further select at least one corresponding bit line (BL) in response to the column address (CA).

The sensitive amplifier 100 is connected to the large number of bit lines (BLs) in the memory array 300. The sensitive amplifier 100 is configured to perform an adjustable offset cancellation operation, a SA operation, or the like in response to the sensitive control signal transmitted by the control circuit 700.

The data input and output circuit 800 can be configured to output data to the externally connected data wire DQ according to a voltage difference sensitively amplified by the sensitive amplifier 100.

Figure 2:
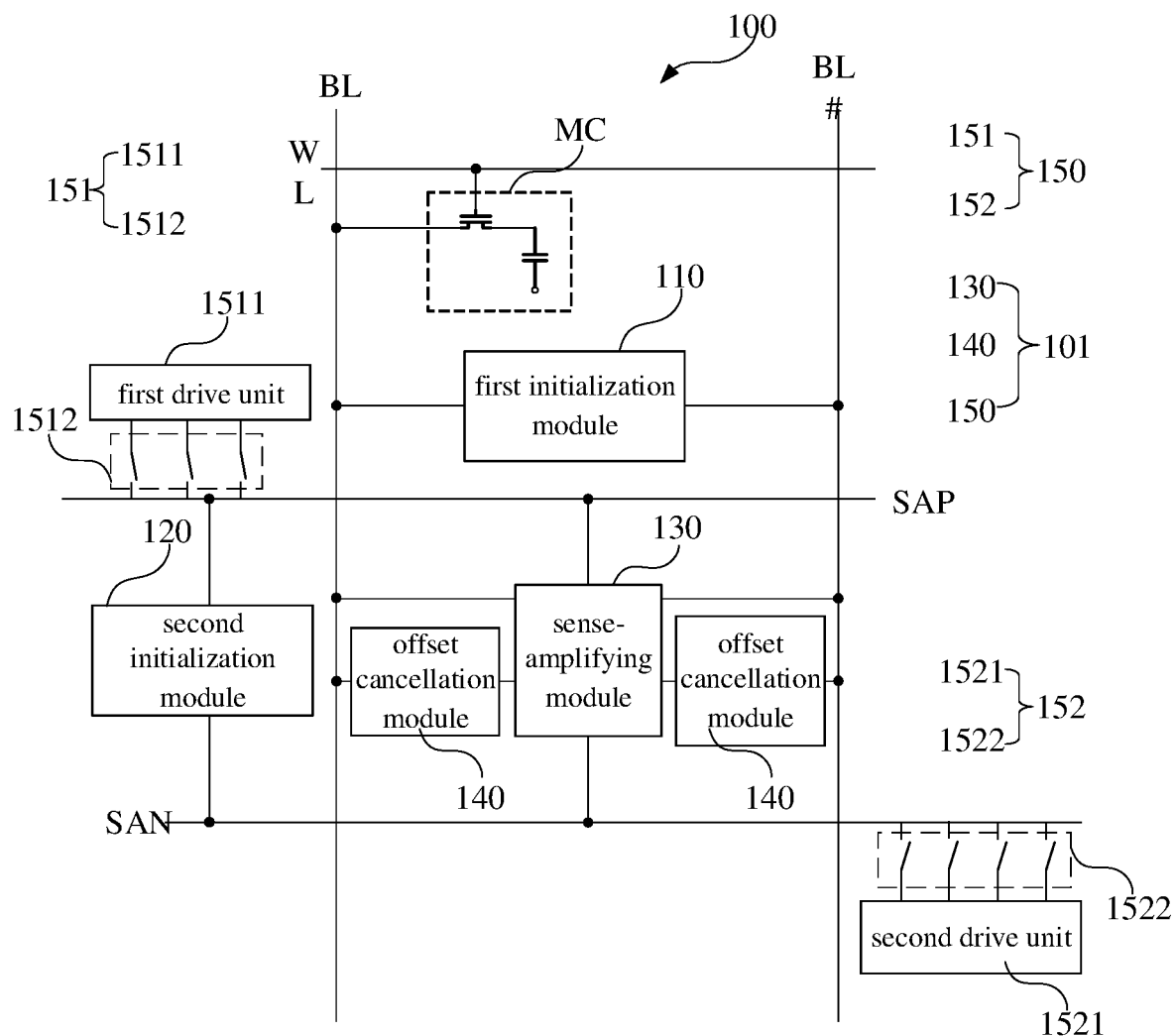
FIG. 2 is a structural schematic view of a sensitive amplifier in FIG. 1 according to an embodiment.

FIG. 2 is a structural schematic view of a sensitive amplifier in FIG. 1 according to an embodiment. The sensitive amplifier 100 may include, but is not limited to, a first initialization module 110, a second initialization module 120, a SA module 130, an offset cancellation module 140 and a drive module 150. The first initialization module 110 is connected between a target bit line (BL) and a complementary bit line (BL #) to provide an initial potential Vref for the target bit line (BL) and the complementary bit line (BL #). SA voltage lines SAP/SAN include a first SA voltage line SAP and a second SA voltage line SAN. The SA voltage lines SAP/SAN are configured to receive a SA voltage. SA voltages include a first SA voltage and a second SA voltage, and a logic level represented by the first SA voltage is opposite to a logic level represented by the second SA voltage. The second initialization module 120 is connected between the first SA voltage line SAP and the second SA voltage line SAN to provide an initial potential Vref for the SA voltage lines SAP/SAN. The drive module 150 is connected to the SA voltage lines SAP/SAN to drive the SA voltage lines SAP/SAN in an offset cancellation stage and a sensing stage. The drive module 150 is an adjustable drive module, and can drive the SA voltage lines SAP/SAN in an adjustable manner, thereby adjusting driving capabilities of the SA voltage lines SAP/SAN. The offset cancellation module 140 is connected between the target bit line (BL) and the SA module 130 and between the complementary bit line (BL #) and the SA module 130 to perform the offset cancellation operation. The SA module 130 is connected between the target bit line (BL) and the complementary bit line (BL #), and is connected to the SA voltage lines SAP/SAN to perform the SA operation.

Figure 3:
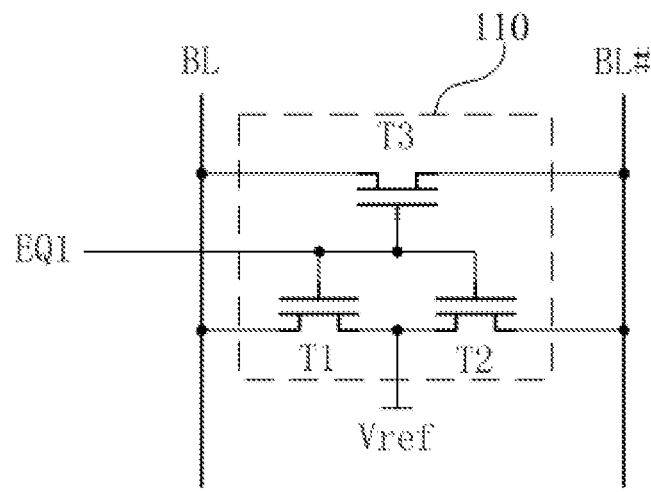
FIG. 3 is a structural schematic view of a first initialization module in FIG. 2.

FIG. 3 is a structural schematic view of a first initialization module in FIG. 2. The first initialization module 110 includes a switch T1, a switch T2 and a switch T3. Control ends of the switch T1, the switch T2 and the switch T3 are configured to receive a first pre-charge control signal EQ1. A first channel end of the switch T1 is connected to the target bit line (BL). A first channel end of the switch T2 is connected to the complementary bit line (BL #). Second channel ends of the switch T1 and the switch T2 are connected to the initial potential Vref (in one embodiment, Vref=½Vcc). A first channel end of the switch T3 is connected to the target bit line (BL), and a second channel end of the switch T3 is connected to the complementary bit line (BL #).

In a pre-charging stage, the first pre-charging control signal EQ1 is configured to control the switch T1 and the switch T2 to be tuned on, and is configured to charge the target bit line (BL) and the complementary bit line (BL #) through the initial potential Vref, so that the potentials of the target bit line (BL) and complementary bit line (BL #) are the initial potentials. Furthermore, the first pre-charge control signal EQ1 is configured to control the switch T3 to be turned on, so that the potentials of the target bit line (BL) and the complementary bit line (BL #) are consistent.

Alternatively, the above switches T1, T2 and T3 can be nMOS transistors. Preferably, if the first pre-charge control signal EQ1 is effective at low level, the switches T1, T2 and T3 can be pMOS transistors.

Figure 4:
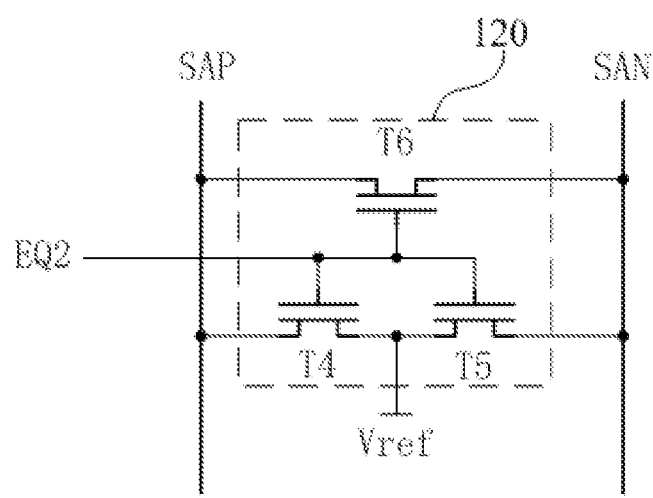
FIG. 4 is a structural schematic view of a second initialization module in FIG. 2 according to an embodiment.

FIG. 4 is a structural schematic view of a second initialization module in FIG. 2 according to an embodiment. The second initialization module 120 includes a switch T4, a switch T5 and a switch T6. Control ends of the switch T4, the switch T5 and the switch T6 are configured to receive a second pre-charge control signal EQ2. A first channel end of the switch T4 is connected to the first SA voltage line SAP, a first channel end of the switch T5 is connected to the second SA voltage line SAN, second channel ends of the switch T4 and the switch T5 are connected to the initial potential Vref (in an embodiment, Vref=½Vcc), a first channel end of the switch T6 is connected to the first SA voltage line SAP, and a second channel end of switch T6 is connected to the second SA voltage line SAN.

In the pre-charging stage, the second pre-charging control signal EQ2 is configured to control the switch T4 and the switch T5 to be turned on, and is configured to charge the first SA voltage line SAP and the second SA voltage line SAN through the initial potential Vref, so that the potentials of the first SA voltage line SAP and the second SA voltage line SAN are the initial potentials. Furthermore, the second pre-charge control signal EQ2 is configured to control the switch T6 to be turned on, so that the potentials of the first SA voltage line SAP and the second SA voltage line SAN are consistent.

Alternatively, the switches T4, T5 and T6 described above can be nMOS transistors. Preferably, if the second pre-charge control signal EQ2 is effective at low level, the above switches T4, T5 and T6 can be pMOS transistors.

Figure 5:
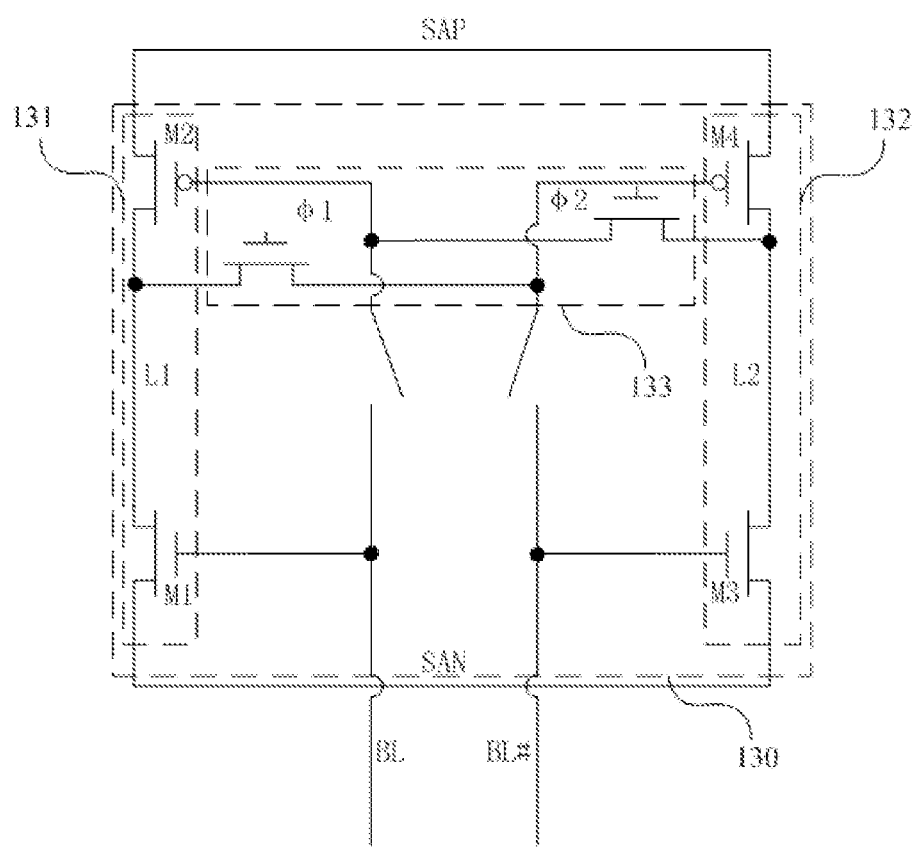
FIG. 5 is a structural schematic view of a sensitivity amplification module in FIG. 2 according to an embodiment.

FIG. 5 is a structural schematic view of a sensitivity amplification module in FIG. 2 according to an embodiment. The SA module 130 includes a first inversion unit 131, a second inversion unit 132 and a fifth switching unit 133. The first inversion unit 131 is connected between the target bit line (BL) and the complementary bit line (BL #), and is connected to the first SA voltage line SAP and the second SA voltage line SAN. In the sensing stage, the first SA voltage line SAP is driven to a state of the first SA voltage, and the second SA voltage line SAN is driven to a state of the second SA voltage; the first inversion unit 131 is configured to pull a complementary bit-line voltage Vbl # of the complementary bit line (BL #) to one of the SA voltages (the voltages of SAP and SAN) based on a target bit-line voltage Vbl of the target bit line (BL) sharing storage charges; and the second inversion unit 132 is connected between the complementary bit line (BL #) and the target bit line (BL), and is connected to the first SA voltage line SAP and the second SA voltage line SAN. In the sensing stage, the second inversion unit 132 is configured to pull the target bit-line voltage Vbl of the target bit line (BL) to the other of the SA voltages (the other of the voltages of SAP and SAN) based on the complementary bit-line voltage Vbl # pulled to one of the SA voltages of the complementary bit line (BL #).

Furthermore, the first inversion unit 131 includes a first transistor M1 and a second transistor M2. A control end of the first transistor M1 is connected to the target bit line (BL), and a first channel end of the first transistor M1 is connected to the second SA voltage line SAN. A control end of the second transistor M2 is configured to be connected to the control end of the first transistor M1, and a first channel end of the second transistor M2 is connected to the first SA voltage line SAP. A second channel end of the first transistor M1 and a second channel end of the second transistor M2 are connected via a first connection line L1, and the first connection line L1 is configured to be connected to the complementary bit line (BL #). The second inversion unit 132 includes a third transistor M3 and a fourth transistor M4. A control end of the third transistor M3 is connected to the complementary bit line (BL #), and a first channel end of the third transistor M3 is connected to the second SA voltage line SAN. A control end of the fourth transistor M4 is configured to be connected to the control end of the third transistor M3, and a first channel end of the fourth transistor M4 is connected to the first SA voltage line SAP. A second channel end of the third transistor M3 and a second channel end of the fourth transistor M4 are connected via a second connection line L2, and the second connection line L2 is configured to be connected to the target bit line (BL).

Furthermore, the fifth switch unit 133 includes a seventh switch φ1 and an eighth switch φ2. The seventh switch φ1 is connected between the first connection line L1 and the control end of the complementary bit line (BL #) or the fourth transistor M4. The eighth switch φ2 is connected between the second connection line L2 and the control end of the target bit line (BL) or the second transistor M2. In the offset cancellation stage, a charge sharing stage and the sensing stage, the seventh switch φ1 and the eighth switch φ2 are turned on.

Figure 6:
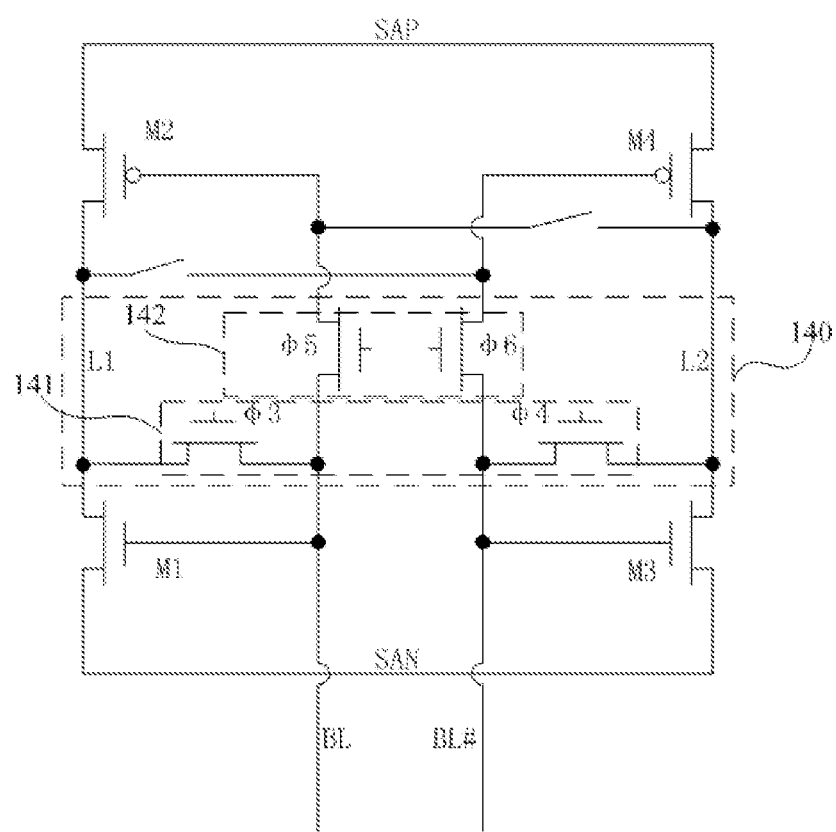
FIG. 6 is a structural schematic view of an offset cancellation module in FIG. 2 according to an embodiment.

FIG. 6 is a structural schematic view of an offset cancellation module in FIG. 2 according to an embodiment. The offset cancellation module 140 includes a third switch unit 141 and a fourth switch unit 142. The third switch unit 141 includes a third switch φ3 and a fourth switch φ4. The third switch φ3 is connected between the control end of the first transistor M1 and the second channel end of the first transistor M1. The fourth switch φ4 is connected between the control end of the third transistor M3 and the second channel end of the third transistor M3. In the offset cancellation stage, the third switch φ3 and the fourth switch φ4 are turned on, so that the first transistor M1 and the third transistor M3 are diode-connected respectively, and are configured to perform the offset cancellation operation by a driving capability of the first SA voltage line SAP and a driving capability of the second SA voltage line SAN (i.e. the voltages of both lines). In the charge sharing stage and the sensing stage, the third switch φ3 and the fourth switch φ4 are turned off. The fourth switch unit 142 includes a fifth switch φ5 and a sixth switch φ6. The fifth switch φ5 is connected between the control end of the second transistor M2 and the control end of the first transistor M1. The sixth switch φ6 is connected between the control end of the fourth transistor M4 and the control end of the third transistor M3. In the offset cancellation stage, the fifth switch φ5 and the sixth switch φ6 are turned off.

Figure 7:
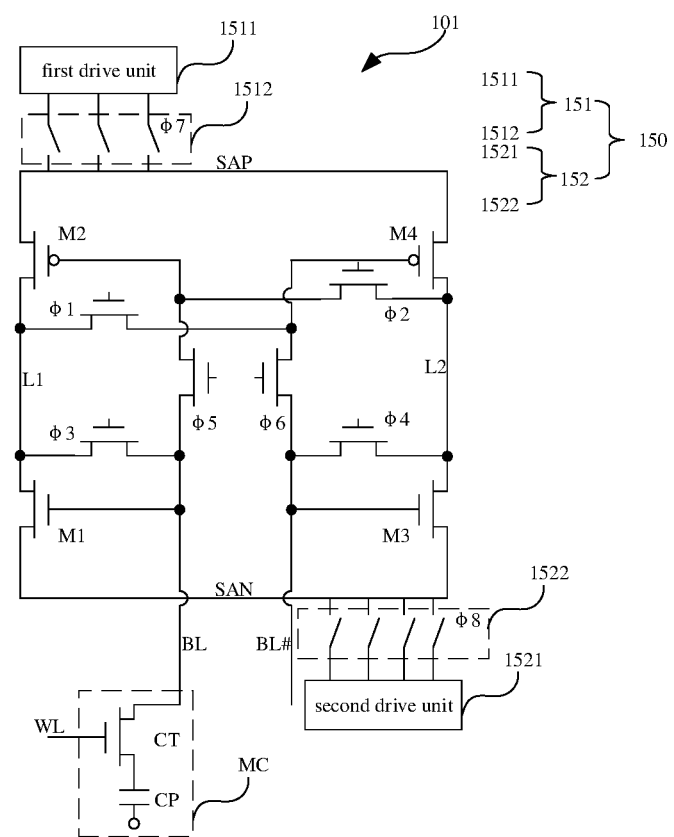
FIG. 7 is a structural schematic view of a sense-amplifying (SA) compensation circuit according to an embodiment provided by the present disclosure.

FIG. 7 is a structural schematic view of a SA compensation circuit according to an embodiment provided by the present disclosure. The SA compensation circuit 101 includes a SA module 130, an offset cancellation module 140 and a drive module 150. The SA module 130 is connected between the target bit line (BL) and the complementary bit line (BL #), and between the first SA voltage line SAP and the second SA voltage line SAN. The offset cancellation module 140 is connected between the target bit line (BL) and the SA module 130 and between the complementary bit line (BL #) and the SA module 130. The drive module 150 includes a first drive sub-module 151 and a second drive sub-module 152. The first drive sub-module 151 is connected to the first SA voltage line SAP to drive the first SA voltage line SAP. The second drive sub-module 152 is connected to the second SA voltage line SAN and is configured to drive the second SA voltage line SAN, and the logic level represented by the first SA voltage is opposite to the logic level represented by the second SA voltage, for example, a high logic level and a low logic level. Furthermore, the first drive sub-module 151 includes a first drive unit 1511 and a first switch unit 1512. The first drive unit 1511 is configured to provide the first SA voltage, and the first drive unit 1511 is connected to the first SA voltage line SAP via the first switch unit 1512. The second drive sub-module 152 includes a second drive unit 1521 and a second switch unit 1522. The second drive unit 1521 is configured to provide the second SA voltage, and the second drive unit 1521 is connected to the second SA voltage line SAN via the second switch unit 1522. Moreover, the first switch unit 1512 includes a plurality of first switches φ7. The second switch unit 1522 includes a plurality of second switches φ8. The SA compensation circuit 101 is configured to perform the adjustable offset cancellation operation and the SA operation to realize compensation for data reading deviation.

Specifically, referring to FIGS. 5, 6 and 7, the transistors M1, M2, M3 and M4 constituting the SA module 130 may have different characteristics, such as threshold voltages, from each other due to changes in process, voltage or temperature (PVT). Inconsistency of threshold voltages of the transistors M1, M2, M3 and M4 causes the SA module 130 to generate offset noise. The offset noise will reduce an effective sensing margin of the SA module 130, thus worsening the read and write performance of the dynamic random access memory. Therefore, the offset cancellation module 140 is required to perform the offset cancellation operation in the active process to eliminate the offset noise and ensure the effective sensing margin of the SA module 130. The effect of performing offset cancellation operation will affect the accuracy of the dynamic random access memory reading different data. In other words, adjusting the offset cancellation operation can compensate for a reading deviation. The drive module 150 in the SA compensation circuit 101 is an adjustable drive module, and can drive the SA voltage lines SAP/SAN in an adjustable manner, to adjust the driving capabilities of the SA voltage lines SAP/SAN and adjust the effect of offset cancellation operation, thereby realizing the compensation of data reading deviation.

Furthermore, the sensitive amplifier 100 responds to the active command, including the following operation process: the pre-charging stage, the offset cancellation stage, the charge sharing stage, the sensing stage, and a restoring stage.

In the pre-charging stage, the first initialization module 110 is configured to pull the target bit-line voltage Vbl of the target bit line (BL) and the complementary bit-line voltage Vbl of the complementary bit line (BL #) to the initial potential Vref; at the same time, the second initialization module 120 is configured to pull a voltage Vsap of the first SA voltage line SAP and a voltage Vsan of the second SA voltage line SAN to the initial potential Vref.

In the offset cancellation stage, at least one of the first drive sub-module 151 and the second drive sub-module 152 is adjustable, and can be configured to drive the SA voltage lines SAP/SAN in an adjustable manner, drive the voltage Vsap of the first SA voltage line SAP to the state of the first SA voltage, for example, pull up to Vref+, and drive the voltage Vsan of the second SA voltage line SAN to the state of the second SA voltage, for example, pull down to Vref−. If the driving capability of the first drive sub-module 151 is increased, Vsap can be pulled up to Vref++; if the driving capability of the second drive sub-module 152 is increased, Vsan can be pulled down to Vref−−; and Vref++>Vref+>Vref>Vref−>Vref−.

Alternatively, at least one of the first switch unit 1512 and the second switch unit 1522 is an adjustable switch unit, and can be configured to drive the SA voltage lines SAP/SAN in an adjustable manner, can be configured to pull the voltage Vsap of the first SA voltage line SAP up to Vref+, and can be configured to pull the voltage Vsan of the second SA voltage line SAN down to Vref−. If the driving capability of the first switch unit 1512 is increased, Vsap can be pulled up to Vref++; if the driving capability of the second switch unit 1522 is increased, Vsan can be pulled down to Vref−−; and Vref++>Vref+>Vref>Vref−>Vref−.

Alternatively, the SA voltage lines SAP/SAN can be driven by adjusting quantity of turned-on first switches φ7 of the plurality of first switches φ7 and/or quantity of turned-on second switches φ8 of the plurality of second switches φ8, the voltage Vsap of the first SA voltage line SAP can be pulled up to Vref+, and the voltage Vsan of the second SA voltage line SAN can be pulled down to Vref−. If the quantity of turned-on first switches φ7 of the plurality of first switches φ7 is increased, Vsap can be pulled up to Vref++; If the quantity of turned-on second switches φ8 of the plurality of second switches φ8 is increased, Vsan can be pulled down to Vref−−; and Vref++>Vref+>Vref>Vref−>Vref−.

Next, the offset cancellation module 140 is configured to perform the offset cancellation operation driven by the first SA voltage line SAP and the second SA voltage line SAN, thereby generating an offset cancellation voltage Vos between the target bit line (BL) and the complementary bit line (BL #). The driving capabilities of the SA voltage lines SAP/SAN will affect the effect of the offset cancellation operation performed by the offset cancellation module 140, that is, a value of the offset cancellation voltage Vos, thereby subsequently affecting the accuracy of reading of different data in the memory cells (MCs).

Therefore, when the drive module 150 drives the SA voltage lines SAP/SAN in the adjustable manner to adjust the driving capabilities of the SA voltage lines SAP/SAN to perform the offset cancellation operation, the data reading deviation can be compensated according to the demand.

In the charge sharing stage, referring to FIG. 7, a memory cell (MC) is connected between the target bit line (BL) and the word line WL. The memory cell (MC) includes a storage capacitor CP and an access switch CT. The storage capacitor CP is connected between the access switch CT and a common end. The access switch CT is connected between the storage capacitor CP and the target bit line (BL), and a control end of the access switch CT is connected to the word line (WL). The storage capacitor CP represents the logical "1" and "0" by more or less of the amount of charge stored in thereof, or high and low voltage differences between the two ends of the storage capacitor. A turned-on state or a turned-off state of the access switch CT determines whether to allow or prohibit the reading and rewriting of information stored in the storage capacitor CP. Specifically, the word line (WL) determines the access switch CT to be turned-on or turned-off. The bit line (BL) is an only channel for the external world to access the storage capacitor CP. When the access switch CT is turned on, the external world can read or write the storage capacitor CP through the bit line (BL).

In one embodiment, a common end (Common) of the storage capacitor CP is connected to Vref. In one embodiment, Vref=Vcc/2.

When the information stored in the storage capacitor CP is "1", a voltage of the other end of the storage capacitor CP is Vcc, and the storage charges comply with Q=+Vref*C.

When the information stored in the storage capacitor CP is "0", the voltage of the other end of the storage capacitor CP is 0, and the storage charges comply with Q=−Vref*C.

At the stage, the target bit line (BL) is configured to share the storage charges stored in the corresponding turned-on MC. When the memory cell (MC) stores "1", that is, the voltage of the common end of the storage capacitor CP is Vcc/2, the voltage of the other end of the storage capacitor CP is Vcc, and the target bit-line voltage Vbl of the target bit line (BL) is pulled up; when the memory cell (MC) stores "0", that is, the voltage of the common end of the storage capacitor CP is Vcc/2, and the voltage of the other end of the storage capacitor CP is 0, the target bit-line voltage Vbl of the target bit line (BL) is pulled down.

In the sensing stage, the first drive sub-module 151 is configured to pull the voltage Vsap of the first SA voltage line SAP up to the first SA voltage, and the second drive sub-module 152 is configured to pull the voltage Vsan of the second SA voltage line SAN down to the second SA voltage. Based on Vsap and Vsan, the SA module 130 can be configured to pull the target bit-line voltage Vbl of the target bit line (BL), which has shared the storage charges to one of the first SA voltage and the second SA voltage, and can be configured to pull the complementary bit-line voltage Vbl # of the complementary bit line (BL #) to the other of the first SA voltages and the second SA voltage.

Specifically, when the memory cell (MC) sharing charges with the target bit line (BL) stores "1", the SA module 130 can be configured to pull the target bit-line voltage Vbl of the target bit line (BL) sharing the storage charges to the first SA voltage (high logic level), and can be configured to pull the complementary bit-line voltage Vbl of the complementary bit line (BL #) to the second SA voltage (low logic level); when the memory cell (MC) sharing the charges with the target bit line (BL) stores "0", the SA module 130 can be configured to pull the target bit-line voltage Vbl of the target bit line (BL) sharing the storage charges to the second SA voltage, and can be configured to pull the complementary bit-line voltage Vbl # of the complementary bit line (BL #) to the first SA voltage (high logic level).

In the restoring stage, the target bit line (BL) will charge or discharge the storage capacitor CP in the memory cell (MC) to a state before the charge sharing operation.

Figure 8:
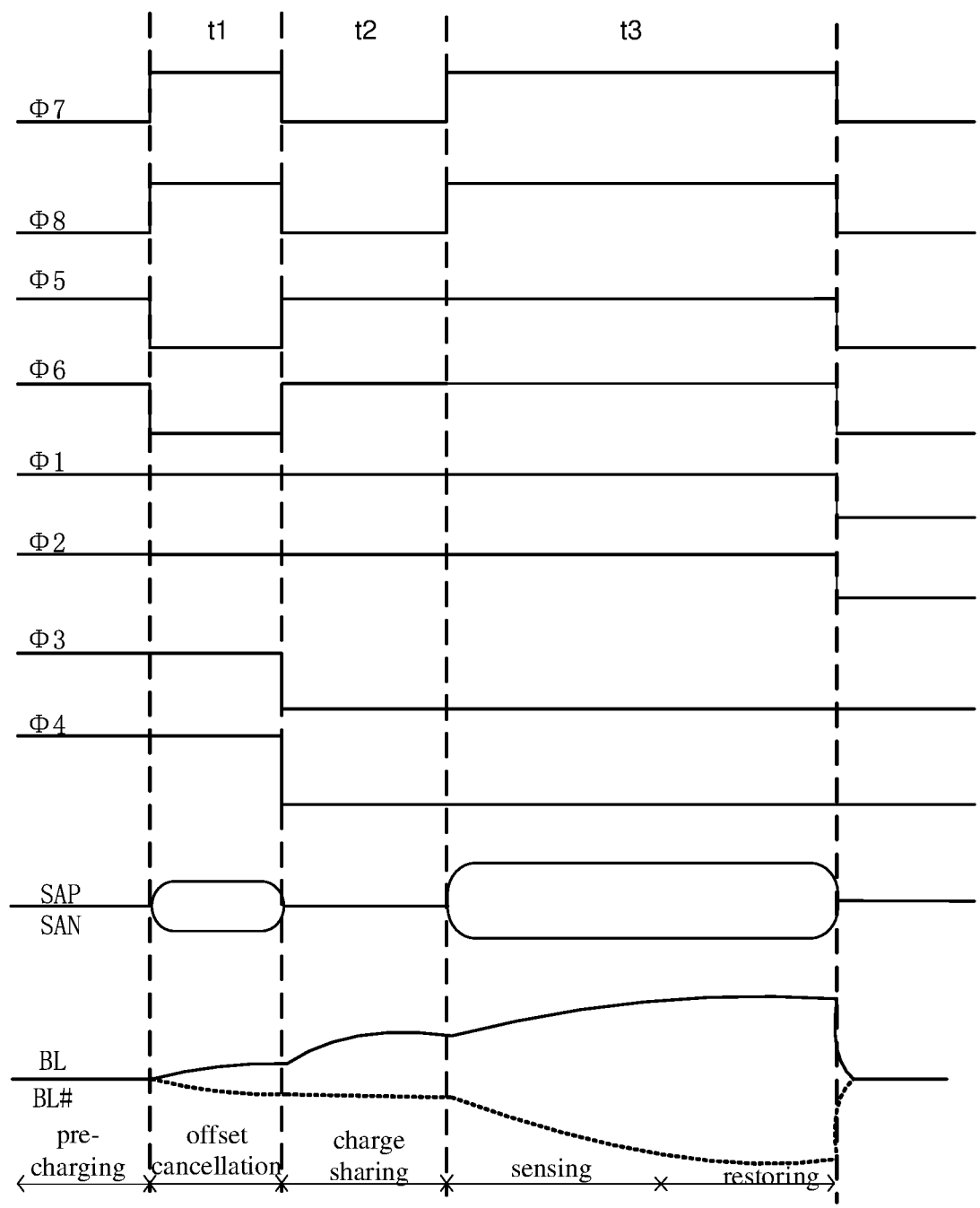
FIG. 8 is a timing diagram of a SA compensation circuit in FIG. 7 according to an embodiment.
Figure 9:
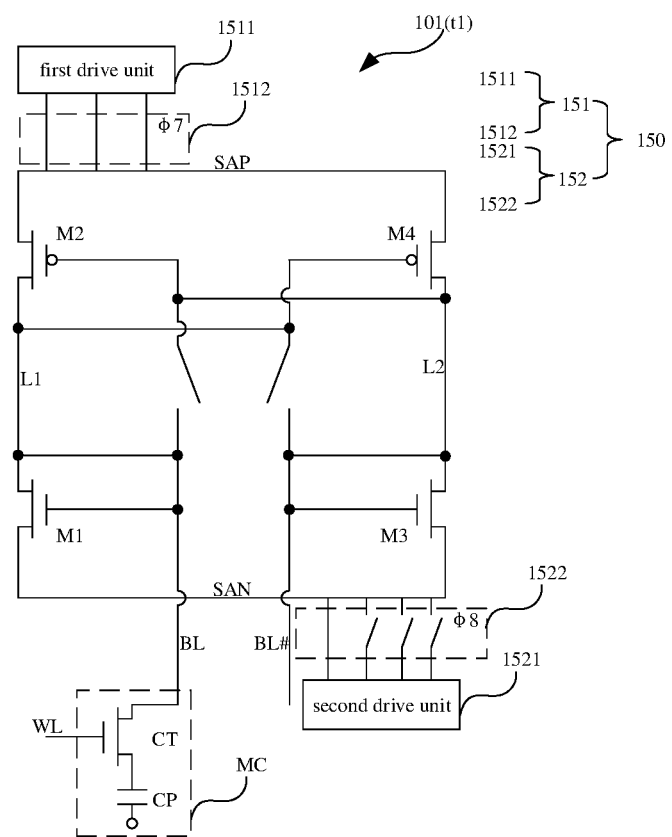
FIG. 9 is a schematic diagram of an equivalent structure of the SA compensation circuit in FIG. 7 in an offset cancellation stage.

FIG. 8 is a timing diagram of a SA compensation circuit in FIG. 7 according to an embodiment, and FIG. 9 is a schematic diagram of an equivalent structure of the SA compensation circuit in FIG. 7 in an offset cancellation stage. The following will describe in detail how the sensitive amplifier compensation circuit 101 compensates the reading deviation by adjusting and performs the offset cancellation operation when the sensitive amplifier 100 responds to the active command.

About the SA compensation circuit 101, in the pre-charging stage, all of the plurality of first switches φ7 and all of the plurality of second switches φ8 are turned off, the seventh switch φ1, the eighth switch φ2, the third switch φ3, the fourth switch φ4, the fifth switch φ5 and the sixth switch φ6 are turned on. The voltages of the first SA voltage line SAP and the second SA voltage line SAN are pulled up to Vref. At this time, the voltages of the target bit line (BL) and the complementary bit line (BL #) are also Vref. That is, before receiving the activation command ACTIVE and starting the active operation, the voltages of the first SA voltage line SAP and the second SA voltage line SAN are equal, and both are the initial value Vref.

Alternatively, Vref=Vcc/2=0.5V.

About the SA compensation circuit 101, in the offset cancellation stage, referring to FIG. 9, more than one of or all of the plurality of first switches φ7 and more than one of or all of the plurality of second switches φ8 are turned on, and the first drive unit 1511 is configured to drive the first SA voltage line SAP to the potential Vref+ through the first switch φ7, Vref+ is greater than the initial potential Vref, and the second drive unit 1521 is configured to drive the second SA voltage line SAN to the potential Vref− through the second switch φ8, and Vref− is less than the initial potential Vref.

The third switch φ3 and the fourth switch φ4 are turned on, the control end of the first transistor M1 is connected to the second channel end, and the control end of the third transistor M3 is connected to the second channel end, so that the first transistor M1 and the third transistor M3 are equivalent to the diode connection respectively. The first transistor M1 and the third transistor M3 are turned on, and the second SA voltage line SAN is configured to pull the target bit-line voltage Vbl of the target bit line (BL) and the complementary bit-line voltage Vbl # of the complementary bit line (BL #) down based on the target bit-line voltage Vbl of the target bit line (BL) and the complementary bit-line voltage Vbl # of the complementary bit line (BL #) are Vref, and the voltage Vsan of the second SA voltage line SAN is Vref− (where Vref− is sufficiently less than Vref). Under the circumstance, a threshold voltage difference between the first transistor M1 and the third transistor M3 is reflected in a voltage difference between the target bit-line voltage Vbl and the complementary bit-line voltage Vbl #. In this way, an offset cancellation voltage can be generated between target bit line (BL) and complementary bit line (BL #), and the offset cancellation voltage complies with Vos=|Vbl−Vbl #|.

The seventh switch φ1 and the eighth switch φ2 are turned on, and the voltage Vsap of the first SA voltage line SAP is Vref+(where Vref+ is greater than Vref). The seventh switch φ1 is turned on to make the fourth transistor M4 turn on under the control of the target bit-line voltage Vbl, and a current flowing into the complementary bit line (BL #) supplements a current flowing out of the complementary bit line (BL #). The current flowing into the complementary bit line (BL #) is a current Im4 flowing through the fourth transistor M4, and the current flowing out of the complementary bit line (BL #) is a current Im3 flowing through the third transistor M3. The eighth switch φ2 is turned on to make the second transistor M2 turn on under the control of the complementary bit-line voltage Vbl #, and a current flowing into the target bit line (BL) supplements a current flowing out of the target bit line (BL). The current flowing into the target bit line (BL) is a current Im2 flowing through the second transistor M2, and the current flowing out of the target bit line (BL) is a current Im1 flowing through the first transistor M1 (at this time as a diode).

Furthermore, when the threshold voltage of the first transistor M1 is greater than the threshold voltage of the third transistor M3, the first transistor M1 is turned on more slowly than the third transistor M3 under the drive of the second SA voltage line SAN, then the current Im1 flowing through the first transistor M1 is less than the current Im3 flowing through the third transistor M3; at the same time, under the drive of the first SA voltage line SAP (where after the first transistor M1 and the third transistor M3 are turned on, the target bit-line voltage Vbl and the complementary bit-line voltage Vbl # are sufficiently less than Vref+), because the current Im1 flowing through the first transistor M1 is less than the current Im3 flowing through the third transistor M3, that is, the fourth transistor M4 under the control of the target bit-line voltage Vbl turned on more slowly than the second transistor M2 under the control of the complementary bit-line voltage Vbl #, the current Im2 flowing through the second transistor M2 is greater than the current Im4 flowing through the fourth transistor M4. Therefore, after the offset cancellation operation is performed, the target bit-line voltage Vbl is greater than the complementary bit-line voltage Vbl #, which can compensate a voltage difference between the threshold voltage of the first transistor M1 and the threshold voltage of the third transistor M3.

Analysis is similar when the threshold voltage of the first transistor M1 is lower than the threshold voltage of the third transistor M3 or in other cases. It will no longer be described herein The fifth switch φ5 and the sixth switch φ6 are turned off, the fifth switch φ5 is turned off to make the second transistor M2 is turned on under the control of complementary bit-line voltage Vbl # when the eighth switch φ2 is turned on, and the sixth switch φ6 is turned off to make the fourth transistor M4 is turned on under the control of the target bit-line voltage Vbl when the seventh switch φ1 is turned on. In this way, cross feedback control can be formed.

In the above way, the offset cancellation module 140 can be configured to perform the offset cancellation operation in the offset cancellation stage and can be configured to generate the offset cancellation voltage Vos between the target bit line (BL) and the complementary bit line (BL #) to compensate for the threshold voltage difference between the first transistor M1 and the third transistor M3, thereby eliminating the difference between the two transistors.

Furthermore, in response to the memory cell (MC) needing to compensate for ability to read data "0", the quantity of turned-on first switches φ7 of the plurality of first switches φ7 in the first switch unit 1512 can be controlled to be greater than the quantity of turned-on second switches φ8 of the plurality of second switches φ8 in the second switch unit 1522 in the offset cancellation stage, to make the driving capability of the first SA voltage line SAP greater than the driving capability of the second SA voltage line SAN; alternatively, all of the plurality of first switches φ7 in the first switch unit 1512 are controlled to be turned on to make the first switch unit 1512 in a strong-driving state, and one of the plurality of second switches φ8 in the second switch unit 1522 is controlled to be turned on to make the second switch unit 1522 in a normal-driving state to make the driving capability of the first SA voltage line SAP greater than that of the second SA voltage line SAN. In this way, after the offset cancellation module 140 performs the offset cancellation operation, the target bit-line voltage Vbl of the target bit line (BL) and the complementary bit-line voltage Vbl # of the complementary bit line (BL #) are higher than that in an initial situation, which is conducive to improving the accuracy of reading data "0". It can be understood that the more the quantity of the turned-on first switches φ7 of the plurality of first switches φ7 in the first switch unit 1512, the faster the voltage Vsap of the first SA voltage line SAP is pulled up, therefore, on the premise that time length of the offset cancellation stage is fixed, the higher the voltage Vsap of the first SA voltage line SAP, that is, the stronger the driving capability of the first SA voltage line SAP is. Similarly, the more the quantity of the turned-on second switches φ8 of the plurality of second switches φ8 in the second switch unit 1522, the faster the voltage Vsan of the second SA voltage line SAN is pulled down, therefore, on the premise that time length of the offset cancellation stage is fixed, the lower the voltage Vsan of the second SA voltage line SAN is, that is, the stronger the driving capability of the second SA voltage line SAN is.

When the driving capability of the first SA voltage line SAP is greater than the driving capability of the second SA voltage line SAN, the offset cancellation operation is performed. The current Im2 flowing into the target bit line (BL) is much greater than the current Im1 flowing out of the target bit line (BL). Therefore, after the offset cancellation operation is performed, the target bit-line voltage Vbl of the target bit line (BL) is higher than that in other situations. When the target bit line (BL) accesses the data "0" stored in the memory cell (MC), at the subsequent charge sharing stage, the target bit-line voltage Vbl decreases, while the complementary bit-line voltage Vbl # remains unchanged, and in the sensing stage, the voltage difference |Vbl−Vbl #| changes significantly, which is obviously conducive to reading the data "0" stored in the memory cell (MC).

Similarly, in response to the memory cell (MC) needing to compensate for the ability to read data "1", the quantity of turned-on first switches φ7 of the plurality of first switches φ7 in the first switch unit 1512 can be controlled to be less than the quantity of turned-on second switches φ8 of the plurality of second switches φ8 in the second switch unit 1522 in the offset cancellation stage, to make the driving capability of the first SA voltage line SAP less than the driving capability of the second SA voltage line SAN; alternatively, one of the plurality of first switches φ7 in the first switch unit 1512 is controlled to be turned on to make the first switch unit 1512 in the normal-driving state, and all of the plurality of second switches φ8 in the second switch unit 1522 are controlled to be turned on to make the second switch unit 1522 in the strong-driving state, to make the driving capability of the first SA voltage line SAP less than that of the second SA voltage line SAN. In this way, after the offset cancellation module 140 performs the offset cancellation operation, the target bit-line voltage Vbl of the target bit line (BL) and the complementary bit-line voltage Vbl # of the complementary bit line (BL #) are lower than that in the initial situation. When the target bit line (BL) accesses the data "1" stored in the memory cell (MC), the target bit line Vbl voltage increases, while the complementary bit line Vbl # decreases, and the voltage difference |Vbl–Vbl #| increases, which is conducive to improve the accuracy of reading data "1".

In addition, in the offset cancellation stage, more than one of the first plurality of switches φ7 in the first switch unit 1512 and more than one of the plurality of second switches φ8 in the second switch unit 1522 are turned on to make the driving capability of the first SA voltage line SAP and the driving capability of the second SA voltage line SAN enhance, and performing the offset cancellation operation speed up, thereby reducing the time length of offset cancellation stage. In this way, working time of the entire active stage can be reduced.

It can be understood that when the driving capability of the first SA voltage line SAP and the driving capability of the second SA voltage line SAN are enhanced, the faster the first transistor M1, the third transistor M3, the second transistor M2 and the fourth transistor M4 are turned on, the shorter the time to perform the offset cancellation operation.

In addition, in the offset cancellation stage, adjusting and extending a time length of turning on the first switch unit 1512 and the second switch unit 1522 can enhance the driving capability of the first SA voltage line SAP and the driving capability of the second SA voltage line SAN, thereby improving the effect of performing the offset cancellation operation.

It can be understood that when the circuit size is not enough to support a drive circuit of many gears, that is, limited by the circuit size, the first drive unit 1511 or the second drive unit 1521 cannot support many first switches φ7 or second switches φ8, a speed at which the voltage Vsap of the first SA voltage line SAP is pulled up and a speed at which the voltage Vsan of the second SA voltage line SAN is pulled down are both relatively low. Therefore, under a premise of a certain speed, the voltage Vsap of the first SA voltage line SAP can be increased and the voltage Vsan of the second SA voltage line SAN can be decreased, that is, the driving capability of the first SA voltage line SAP and the driving capability of the second SA voltage line SAN are enhanced, by adjusting and extending the time length of turning on the first switch unit 1512 and the second switch unit 1522.

In the charge sharing stage, the plurality of first switches φ7 and the plurality of second switches φ8 are turned off, and the voltage of the first SA voltage line SAP and the second SA voltage line SAN are recovered to the initial potential Vref.

The third switch φ3 and the fourth switch φ4 are turned off, the fifth switch φ5 and the sixth switch φ6 are turned on, and the target bit line (BL) shares the storage charges in the corresponding turned-on MC.

The seventh switch φ1 and the eighth switch φ2 are turned on, the first connection line L1 is connected to the complementary bit line (BL #) or the control end of the fourth transistor M4, and the second connection line L2 is connected to the target bit line (BL) or the control end of the second transistor M2.

Furthermore, when a sum of a time length t1 of the offset cancellation stage and a time length t2 of the charge sharing stage is set to a certain value, the driving capability of the first SA voltage line SAP and the driving capability of the second SA voltage line SAN can be enhanced by turning on more than one of the plurality of first switches φ7 in the first switch unit 1712 and more than one of the plurality of second switches φ8 in the second switch unit 1522, to reduce the time length t1 of the offset cancellation stage to increase the time length t2 of the charge sharing stage. It can be understood that when the time length t2 of the charge sharing stage increases, the target bit line (BL) can more fully share the storage charges in the corresponding turned-on MC, which is conducive to improving the accuracy of reading data.

In the sensing stage, the first switches φ7 and second switches φ8 are turned on, the fifth switch φ5 and the sixth switch φ6 are turned on, the seventh switch φ1 and the eighth switch φ2 are turned on, and the third switch φ3 and the fourth switch φ4 are turned off. The first SA voltage line SAP and the second SA voltage line SAN are driven to the first SA voltage and the second SA voltage by the first drive unit 1511 via the first switch unit 1512 and by the second drive unit 1521 via the second switch unit 1522, respectively. The SA module 130 can be configured to pull the target bit-line voltage Vbl of the target bit line (BL), which has shared the storage charges to one of the first SA voltage and the second SA voltage, and can be configured to pull the complementary bit-line voltage Vbl # of the complementary bit line (BL #) to the other of the first SA voltage and second SA voltage. Specifically, when the memory cell (MC) stores data "1", the SA module 130 can be configured to pull the target bit-line voltage Vbl of the target bit line (BL), which has shared the storage charges to the first SA voltage, and can be configured to pull the complementary bit-line voltage Vbl # of the complementary bit line (BL #) to the second SA voltage. When the memory cell (MC) stores data "0", the SA module 130 can be configured to pull the target bit-line voltage Vbl of the target bit line (BL), which has shared the storage charges to the second SA voltage, and can be configured to pull the complementary bit-line voltage Vbl # of the complementary bit line (BL #) to the first SA voltage.

Furthermore, in response to the memory cell (MC) needing to compensate for the ability to read data "0", in the sensing stage, time of turning on the first switch unit 1512 is controlled to be earlier than time of turning on the second switch unit 1522, so that the time when the first SA voltage line SAP reaches the first SA voltage is earlier than the time when the second SA voltage line SAN reaches the second SA voltage. In this way, working voltages of target bit line (BL) and complementary bit line (BL #) can be increased, which is conducive to improving the accuracy of reading data "0".

In response to the memory cell (MC) needing to compensate for the ability to read data "1", in the sensing stage, the time of turning on the first switch unit 1512 is controlled to be later than the time of turning on the second switch unit 1522, so that the time when the first SA voltage line SAP reaches the first SA voltage is later than the time when the second SA voltage line SAN reaches the second SA voltage. In this way, the working voltages of the target bit line (BL) and the complementary bit line (BL #) can be reduced, which is conducive to improving the accuracy of reading data "1".

In addition, when a sum of a time length t3 of the sensing stage and a time length t2 of the charge sharing stage is set to a certain value, the fifth switch φ5 and the sixth switch φ6 are turned on after at least one of the first SA voltage line SAP and the second SA voltage line SAN is reached the SA voltage, to make the target bit line (BL) fully share the storage charges in the memory cell (MC), thereby improving the accuracy of reading data.

In the restoring stage, the plurality of first switches φ7 and the plurality of second switches φ8 are turned on, the fifth switch φ5 and the sixth switch φ6 are turned on, the seventh switch φ1 and the eighth switch φ2 are turned on, third switch φ3 and the fourth switch φ4 are turned off. The target bit line (BL) will charge or discharge the storage capacitor CP in the memory cell (MC) to a state before the charge sharing operation. Specifically, when the memory cell (MC) stores data "1", the target bit line (BL) will charge the storage capacitor CP in the memory cell (MC) to the state before the charge sharing operation. When the memory cell (MC) stores data "0", the target bit line (BL) will discharge the storage capacitor CP in the memory cell (MC) to the state before the charge sharing operation.

Figure 10:
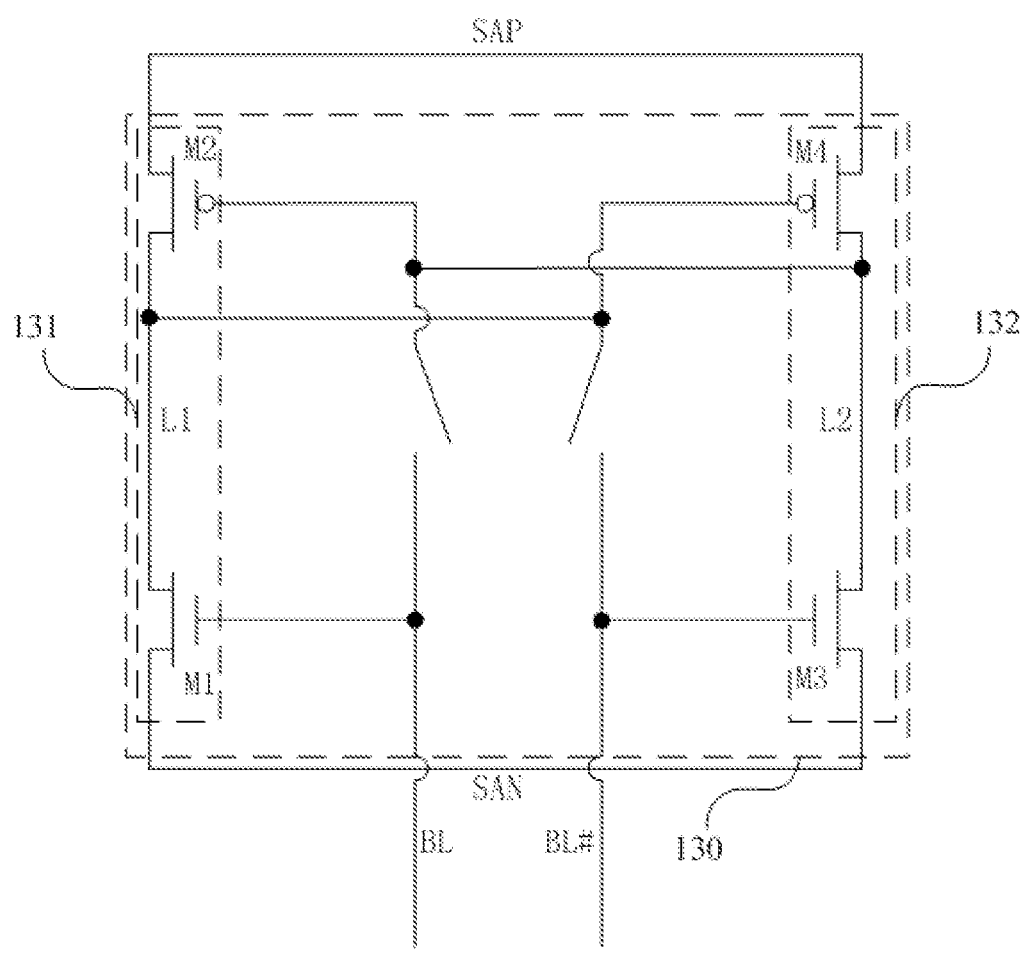
FIG. 10 is a structural schematic view of the sensitivity amplification module in FIG. 2 according to another embodiment.
Figure 11:
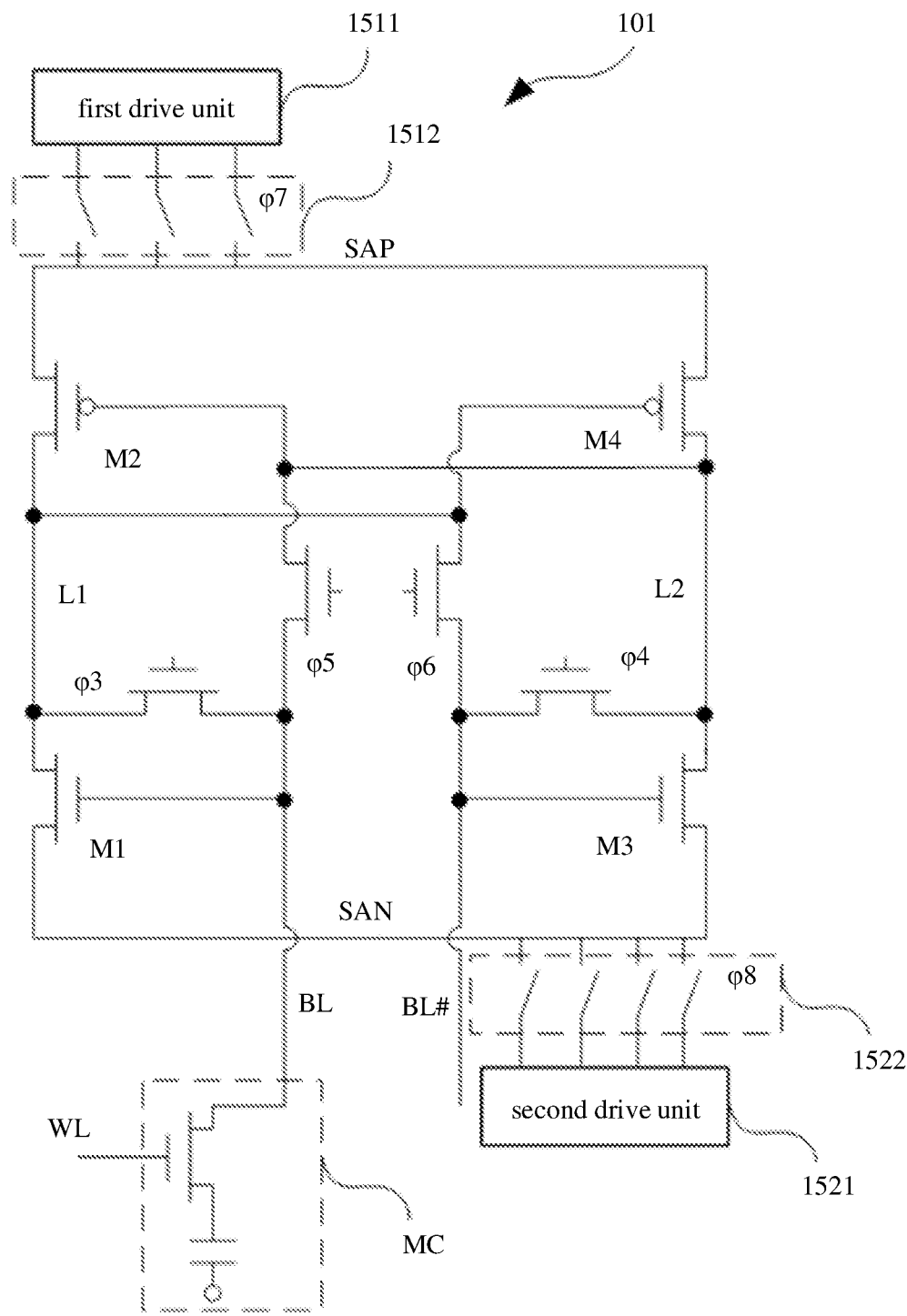
FIG. 11 is a structural schematic view of the SA compensation circuit according to another embodiment of the present disclosure.
Figure 12:
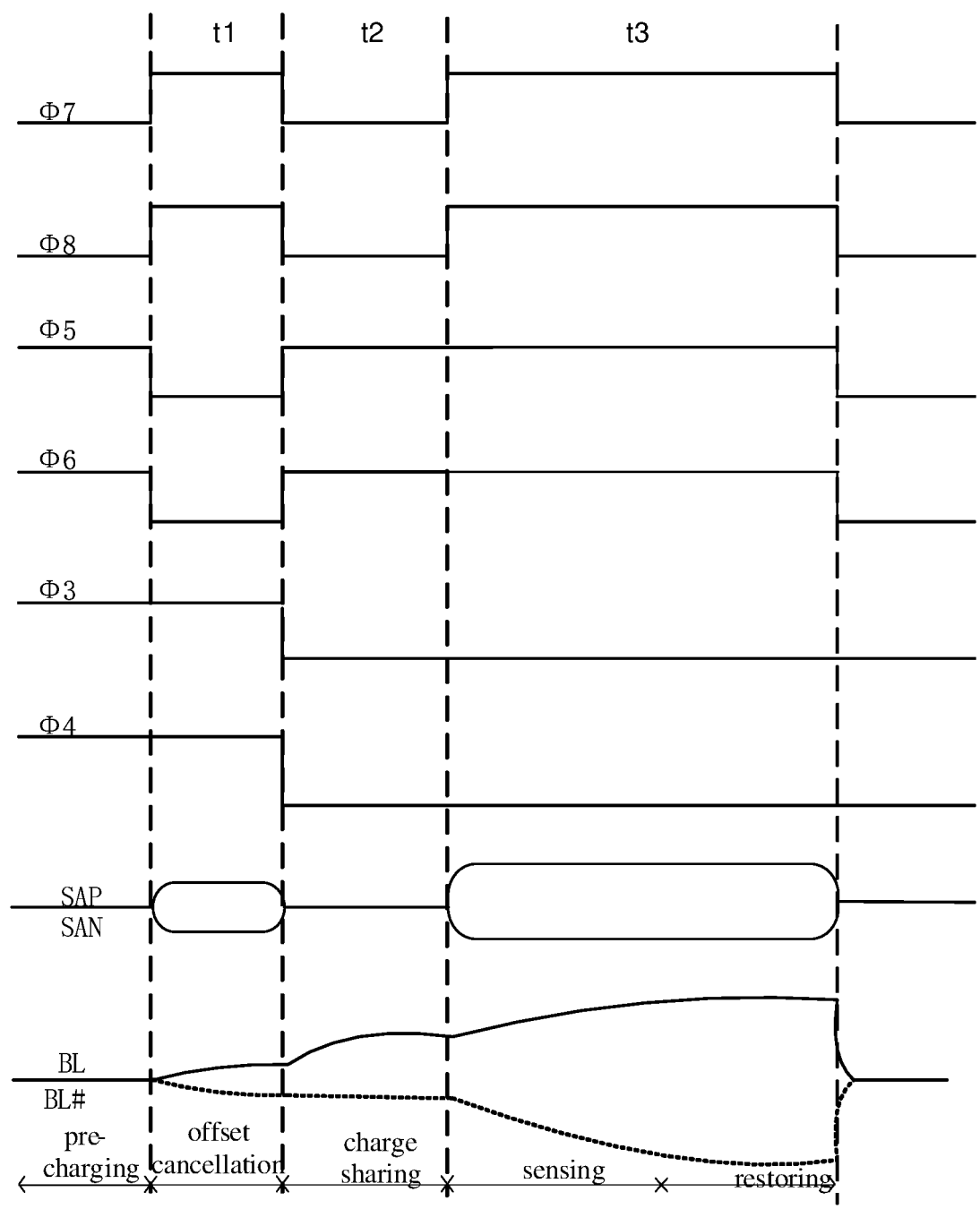
FIG. 12 is a timing diagram of the SA compensation circuit in FIG. 11 according to an embodiment.

FIG. 10 is a structural schematic view of the sensitivity amplification module in FIG. 2 according to another embodiment, FIG. 11 is a structural schematic view of the SA compensation circuit according to another embodiment of the present disclosure, and FIG. 12 is a timing diagram of the SA compensation circuit in FIG. 11 according to an embodiment. Different from FIG. 5, FIG. 7 and FIG. 8, the first connection line L1 in the sensitivity amplification module 130 is directly connected to the control end of the fourth transistor M4. The second connection line L2 is directly connected to the control end of the second transistor M2. In the embodiment, a working process of the sensitive amplifier 100 after responding to the active command is similar to a working process of the above embodiment, which will not be repeated here.

Figure 13:
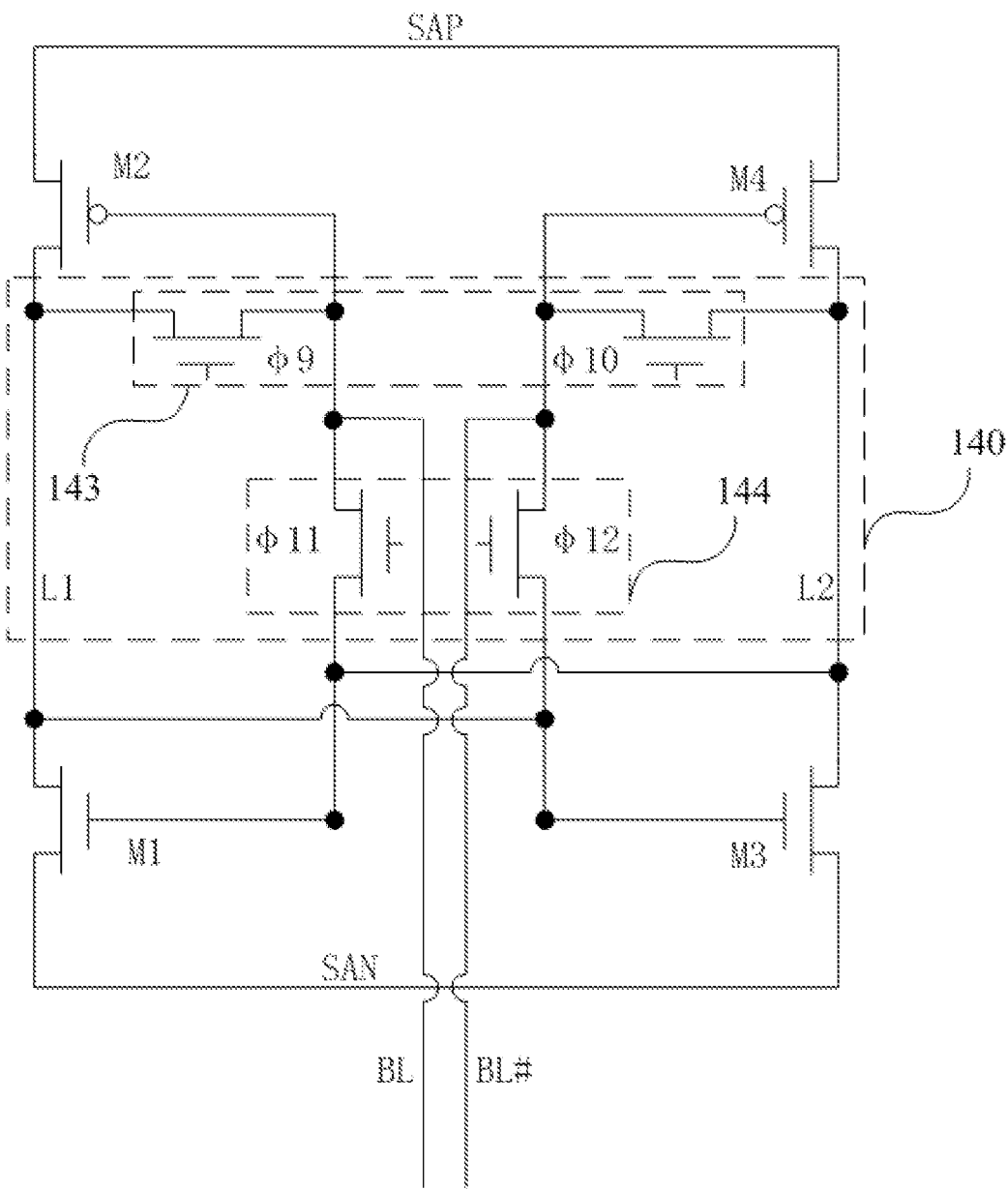
FIG. 13 is a structural schematic view of an offset cancellation module in FIG. 2 according to another embodiment.
Figure 14:
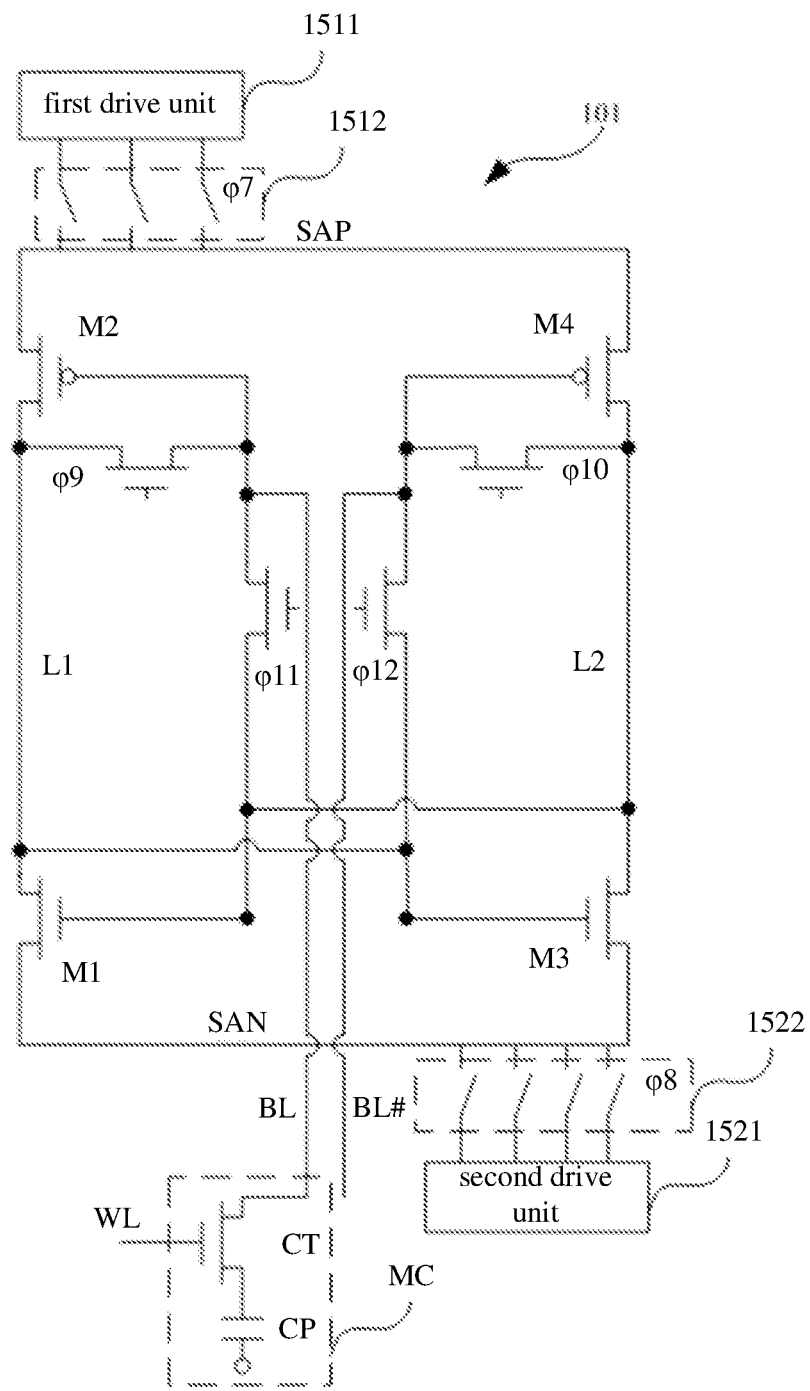
FIG. 14 is a structural schematic view of a SA compensation circuit according to another embodiment of the present disclosure.

FIG. 13 is a structural schematic view of an offset cancellation module in FIG. 2 according to another embodiment, and FIG. 14 is a structural schematic view of a SA compensation circuit according to another embodiment of the present disclosure. The offset cancellation module 140 includes a sixth switch unit 143 and a seventh switch unit 144. The sixth switch unit 143 includes a ninth switch φ9 and a tenth switch φ10. The ninth switch φ9 is connected between the control end and the second channel end of the second transistor M2. The tenth switch φ10 is connected between the control end and the second channel end of the fourth transistor M4. The seventh switch unit 144 includes a eleventh switch φ11 and a twelfth switch φ12. The eleventh switch φ11 is connected between the control end of the second transistor M2 and the control end of the first transistor M1. The twelfth switch φ12 is connected between the control end of the fourth transistor M4 and the control end of the third transistor M3. Different from the above described embodiments, in the embodiment, the target bit line (BL) is connected to the control end of the second transistor M2, and the complementary bit line (BL #) is connected to the control end of the fourth transistor M4.

In the offset cancellation stage, the first switch φ7 and second switch φ8 are turned off, the first drive unit 1511 is configured to drive the SA voltage line SAP in the high logic level to potential Vref+ via the first switch unit 1512, and the second drive unit 1521 is configured to drive the SA voltage line SAN in the low logic level to Vref− via the second switch unit 1522; the eleventh switch φ11 and the twelfth switch φ12 are turned off, so that the first connection line L1 and the third transistor M3, and the second connection line L2 and the first transistor M1 form a cross-coupling latch circuit; the ninth switch φ9 and the tenth switch φ10 are turned on, the second transistor M2 and the fourth transistor M4 are equivalent to the diode connection respectively, and the offset cancellation operation is performed by the driving capability of the SA voltage line SAP in the high logic level and the SA voltage line SAN in the low logic level. In the charge sharing stage and the sensing stage, the ninth switch φ9 and the tenth switch φ10 are turned off.

The driving capability of the SA voltage line SAP in the high logic level and the SA voltage line SAN in the low logic level can be adjusted by adjusting the first switch unit 1512 and the second switch unit 1522, respectively, so as to adjust the effect of performing the offset cancellation operation, thereby realizing the compensation of data reading deviation.

The present disclosure provides the SA compensation circuit 101. The SA compensation circuit 101 includes the SA module 130, the offset cancellation module 140, and the drive module 150. The SA module 130 is connected between the target bit line (BL) and the complementary bit line (BL #), and is connected to the SA voltage lines SAP/SAN. The offset cancellation module 140 is connected between the target bit line (BL) and the SA module 130 and between the complementary bit line (BL #) and the SA module 130, and is configured to perform the offset cancellation operation in the offset cancellation stage. The drive module 150 is configured to be connected the SA voltage lines SAP/SAN and is configured to drive the SA voltage lines SAP/SAN in the offset cancellation stage and the sensing stage. The drive module 150 is an adjustable drive module and is configured to drive the SA voltage lines SAP/SAN in an adjustable manner during the offset cancellation stage to adjust the driving capabilities of the SA voltage lines SAP/SAN to perform the offset cancellation operation. In the above way, the driving capabilities of the SA voltage lines SAP/SAN can be adjusted by adjusting the drive module 150 according to the demand, so as to adjust the effect of the offset cancellation operation, thereby realizing the ability of the memory cell (MC) to compensate for reading data "0"/"1".

The above-described integrated unit may be stored in a computer-readable medium if the embodiment of the present disclosure are implemented in the form of a software functional module and sold or used as a standalone product. Based on such understanding, the technical solution of the present disclosure, in essence or the contribution to the prior art, or all or part of the technical solution may be embodied in the form of a software product. The software product may be stored in a storage medium. The software product may include a number of instructions causing a computer device (the computer device may be a personal computer, a server or a network device, and the like) or a processor to perform all or parts of the operations of the above-described methods of various embodiments of the present disclosure. The foregoing storage medium may include various media which are able to store program codes. The media may include a U disk, a Read-Only Memory (ROM), a Random Access Memory (RAM), a removable hard disk, a magnetic disk, an optical disk, and the like.

The above is only some embodiments of the present disclosure and is not intended to limit the scope of the present disclosure. Any equivalent structure or equivalent process transformation using the specification and the accompanying drawings of the present disclosure, or direct or indirect application in other related technical fields, is included in the scope of the present disclosure.

What is claimed is:

1. A sense-amplifying (SA) compensation circuit, applied in a random access memory (RAM), comprising:
   a SA module, connected between a target bit line and a complementary bit line, and connected to SA voltage lines; wherein, in a charge sharing stage, the target bit line shares storage charges stored in a corresponding turned-on memory cell; and in a sensing stage, the SA module is configured to pull a target bit-line voltage of the target bit line, which has shared the storage charges, to one of a first SA voltage and a second SA voltage, and is configured to pull a complementary bit-line voltage of the complementary bit line, to the other of the first SA voltage and the second SA voltage;
   an offset cancellation module, connected between the target bit line and the SA module, and connected between the complementary bit line and the SA module, and is configured to perform an offset cancellation operation in an offset cancellation stage, for generating an offset cancellation voltage between the target bit line and the complementary bit line; and
   a drive module, configured to be connected to the SA voltage lines and is configured to drive the SA voltage lines to a state of the first SA voltage and the second SA voltage in the offset cancellation stage and the sensing stage;
   wherein the drive module is an adjustable drive module and is configured to drive the SA voltage lines in an adjustable manner during the offset cancellation stage, to adjust driving capabilities of the SA voltage lines to perform the offset cancellation operation.

2. The SA compensation circuit as claimed in claim 1, wherein the SA voltage lines comprise a first SA voltage line and a second SA voltage line;
   the drive module comprises a first drive sub-module and a second drive sub-module, wherein the first drive sub-module is configured to be connected the first SA voltage line and is configured to drive the first SA voltage line; and the second drive sub-module is configured to be connected the second SA voltage line and is configured to drive the second SA voltage line;
   wherein a logic level represented by the first SA voltage is opposite to a logic level represented by the second SA voltage; and
   wherein at least one of the first drive sub-module and the second drive sub-module is adjustable.

3. The SA compensation circuit as claimed in claim 2, wherein
   the first drive sub-module comprises a first drive unit and a first switch unit, the first drive unit is configured to provide the first SA voltage, and the first drive unit is connected to the first SA voltage line via the first switch unit; and
   the second drive sub-module comprises a second drive unit and a second switch unit, the second drive unit is configured to provide the second SA voltage, and the second drive unit is connected to the second SA voltage line via the second switch unit.

4. The SA compensation circuit as claimed in claim 3, wherein
   the first switch unit comprises a plurality of first switches, and the second switch unit comprises a plurality of second switches; and
   in the offset cancellation stage, at least one of a quantity of turned-on first switches of the plurality of first switches and a quantity of turned-on second switches of the plurality of second switches is adjusted, to change at least one of a driving capability of the first SA voltage line and a driving capability of the second SA voltage line to perform the offset cancellation operation.

5. The SA compensation circuit as claimed in claim 4, wherein
   in response to a corresponding memory cell needing to compensate for ability to read data "0", in the offset cancellation stage, the quantity of turned-on first switches of the plurality of first switches is greater than the quantity of turned-on second switches of the plurality of second switches, and driving capability of the first SA voltage line is greater than driving capability of the second SA voltage line;
   in response to the corresponding memory cell needing to compensate for ability to read data "1", in the offset cancellation stage, the quantity of turned-on first switches of the plurality of first switches is less than the quantity of turned-on second switches of the plurality of second switches, and the driving capability of the first SA voltage line is less than the driving capability of the second SA voltage line.

6. The SA compensation circuit as claimed in claim 5, wherein
   in response to the corresponding memory cell needing to compensate for the ability to read data "0", in the offset cancellation stage, all of the plurality of first switches in the first switch unit are turned on to make the first switch unit in a strong-driving state, and one of the plurality of second switches in the second switch unit is turned on to make the second switch unit in a normal-driving state, and the driving capability of the first SA voltage line is greater than the driving capability of the second SA voltage line; and
   in response to the corresponding memory cell needing to compensate for the ability to read data "1", in the offset cancellation stage, one of the plurality of first switches in the first switch unit is turned on to make the first switch unit in a normal-driving state, and all of the plurality of second switches in the second switch unit are turned on to make the second switch unit in a strong-driving state, and the driving capability of the first SA voltage line is less than the driving capability of the second SA voltage line.

7. The SA compensation circuit as claimed in claim 5, wherein in response to a corresponding memory cell needing to compensate for the ability to read data "0", time of turning on the first switch unit is earlier than time of turning on the second switch unit in the sensing stage; and
   wherein in response to a corresponding memory cell to needing to compensate for the ability to read data "1", time of turning on the first switch unit is later than time of turning on the second switch unit in the sensing stage.

8. The SA compensation circuit as claimed in claim 4, wherein, in the offset cancellation stage, more than one of the plurality of first switches in the first switch unit and more than one of the plurality second switches in the second switch unit are turned on, to enhance the driving capability of the first SA voltage line and the driving capability of the second SA voltage line, and reduce a time length of the offset cancellation stage.

9. The SA compensation circuit as claimed in claim 8, wherein when a sum of the time length of the offset cancellation stage and a time length of the charge sharing stage is set to a certain value, the more than one of the plurality of first switches in the first switch unit and the more than one of plurality of second switches in the second switch unit are turned on, to enhance the driving capability of the first SA voltage line and the driving capability of the second SA voltage line, and reduce the time length of the offset cancellation stage to increase the time length of the charge sharing stage.

10. The SA compensation circuit as claimed in claim 3, wherein, in the offset cancellation stage, a time length of turning on the first switch unit and the second switch unit is adjusted and extended, to enhance the driving capability of the first SA voltage line and the driving capability of the second SA voltage line to perform the offset cancellation operation.

11. The SA compensation circuit as claimed in claim 3, wherein the SA module comprises:
   a first inversion unit, configured to be connected between the target bit line and the complementary bit line, and configured to be connected to the first SA voltage line and the second SA voltage line, wherein, in the sensing stage, the first SA voltage line is driven to a state of the first SA voltage, and the second SA voltage line is driven to a state of the second SA voltage, the first inversion unit is configured to pull the complementary bit-line voltage of the complementary bit line to one of the first SA voltage and second SA voltage based on the target bit-line voltage of the target bit line sharing the storage charges; and
   a second inversion unit, configured to be connected between the complementary bit line and the target bit line, and configured to be connected to the first SA voltage line and the second SA voltage line, wherein, in the sensing stage, based on the complementary bit-line voltage of complementary bit line pulled to the second SA voltage, the second inversion unit is configured to pull the target bit-line voltage of the target bit line to the other of the first SA voltage and the second SA voltage.

12. The SA compensation circuit as claimed in claim 11, wherein the first inversion unit comprises:
   a first transistor, wherein a control end of the first transistor is connected to the target bit line, and a first channel end of the first transistor is connected to the second SA voltage line; and
   a second transistor, wherein a control end of the second transistor is connected to the control end of the first transistor, and a first channel end of the second transistor is connected to the first SA voltage line; and a second channel end of the first transistor and a second channel end of the second transistor are connected together via a first connection line, and the first connection line is configured to couple the complementary bit line;
   wherein the second inversion unit comprises:
   a third transistor, wherein a control end of the third transistor is connected to the complementary bit line, and a first channel end of the third transistor is connected to the second SA voltage line; and
   a fourth transistor, wherein a control end of the fourth transistor is connected to the control end of the third transistor, and a first channel end of the fourth transistor is connected to the first SA voltage line; and a second channel end of the third transistor and a second channel end of the fourth transistor are connected together via a second connection line, and the second connection line is configured to couple the target bit line.

13. The SA compensation circuit as claimed in claim 12, wherein the offset cancellation module comprises a third switch unit, and the third switch unit comprises:
   a third switch, connected between the control end of the first transistor and the second channel end of the first transistor; and
   a fourth switch, connected between the control end of the third transistor and the second channel end of the third transistor; and
   wherein, in the offset cancellation stage, the third switch and the fourth switch are turned on, so that the first transistor and the third transistor are diode-connected respectively, and are configured to perform the offset cancellation operation by the driving capability of the first SA voltage line and the driving capability of the second SA voltage line; and in the charge sharing stage and the sensing stage, the third switch and the fourth switch are turned off.

14. The SA compensation circuit as claimed in claim 13, wherein the offset cancellation module further comprises a fourth switch unit, and the fourth switch unit comprises:
   a fifth switch, connected between the control end of the second transistor and the control end of the first transistor; and
   a sixth switch, connected between the control end of the fourth transistor and the control end of the third transistor; and
   wherein, in the offset cancellation stage, the fifth switch and the sixth switch are turned off.

15. The SA compensation circuit as claimed in claim 14, wherein the first connection line in the SA module is directly connected to the control end of the fourth transistor; the second connection line is directly connected to the control end of the second transistor; or
   wherein the SA module further comprises a fifth switch unit, and the fifth switch unit comprises:
   a seventh switch, connected between the first connection line and the complementary bit line or the control end of the fourth transistor; and
   an eighth switch, connected between the second connection line and the target bit line or the control end of the second transistor; and
   wherein in the offset compensation stage, the charge sharing stage and the sensing stage, the seventh switch and the eighth switch are turned on.

16. The SA compensation circuit as claimed in claim 12, wherein the offset cancellation module comprises a sixth switch unit, and the sixth switch unit comprises:
   a ninth switch, connected between the control end of the second transistor and the second channel end of the second transistor; and
   a tenth switch, connected between the control end of the fourth transistor and the second channel end of the fourth transistor; and
   wherein, in the offset cancellation stage, the ninth switch and the tenth switch are turned on, so that the second transistor and the fourth transistor are diode-connected respectively, and are configured to perform the offset cancellation operation by the driving capability of the SA voltage line in a high logic level and the SA voltage line in a low logic level; and in the charge sharing stage and the sensing stage, the ninth switch and the tenth switch are turned off.

17. The SA compensation circuit as claimed in claim 12, wherein the offset cancellation module comprises a seventh switch unit, and the seventh switch unit comprises:
   an eleventh switch, connected between the control end of the second transistor and the control end of the first transistor; and a twelfth switch, connected between the control end of the fourth transistor and the control end of the third transistor; and wherein, in the offset cancellation stage, the eleventh switch and the twelfth switch are turned off, so that the first connection line and the third transistor and the second connection line and the first transistor form a cross-coupling latch circuit.

18. The SA compensation circuit as claimed in claim 12, wherein the target bit line is connected to the control end of the second transistor, and the complementary bit line is connected to the control end of the fourth transistor.

19. A random access memory, comprising:
a sense-amplifying (SA) compensation circuit, comprising:
  a SA module, connected between a target bit line and a complementary bit line, and connected to SA voltage lines; wherein, in a charge sharing stage, the target bit line shares storage charges stored in a corresponding turned-on memory cell; and in a sensing stage, the SA module is configured to pull a target bit-line voltage of the target bit line, which has shared the storage charges, to one of a first SA voltage and a second SA voltage, and is configured to pull a complementary bit-line voltage of the complementary bit line, to the other of the first SA voltage and the second SA voltage;
  an offset cancellation module, connected between the target bit line and the SA module, and connected between the complementary bit line and the SA module, and is configured to perform an offset cancellation operation in an offset cancellation stage, for generating an offset cancellation voltage between the target bit line and the complementary bit line; and
  a drive module, configured to be connected to the SA voltage lines and is configured to drive the SA voltage lines to a state of the first SA voltage and the second SA voltage in the offset cancellation stage and the sensing stage;
  wherein the drive module is an adjustable drive module and is configured to drive the SA voltage lines in an adjustable manner during the offset cancellation stage, to adjust driving capabilities of the SA voltage lines to perform the offset cancellation operation.

20. The random access memory as claimed in claim 19, wherein the SA voltage lines comprise a first SA voltage line and a second SA voltage line;
  the drive module comprises a first drive sub-module and a second drive sub-module, wherein the first drive sub-module is configured to be connected the first SA voltage line and is configured to drive the first SA voltage line; and the second drive sub-module is configured to be connected the second SA voltage line and is configured to drive the second SA voltage line;
  wherein a logic level represented by the first SA voltage is opposite to a logic level represented by the second SA voltage; and
  wherein at least one of the first drive sub-module and the second drive sub-module is adjustable.

* * * * *